US009263102B2

(12) United States Patent
Flynn et al.

(10) Patent No.: US 9,263,102 B2
(45) Date of Patent: Feb. 16, 2016

(54) APPARATUS, SYSTEM, AND METHOD FOR DATA TRANSFORMATIONS WITHIN A DATA STORAGE DEVICE

(75) Inventors: David Flynn, Sandy, UT (US); David Nellans, Salt Lake City, UT (US); Robert Wipfel, Draper, UT (US)

(73) Assignee: SanDisk Technologies, Inc., Plano, TX (US)

( * ) Notice: Subject to any disclaimer, the term of this patent is extended or adjusted under 35 U.S.C. 154(b) by 337 days.

(21) Appl. No.: 13/248,016

(22) Filed: Sep. 28, 2011

(65) Prior Publication Data

US 2012/0079175 A1    Mar. 29, 2012

Related U.S. Application Data

(60) Provisional application No. 61/387,082, filed on Sep. 28, 2010.

(51) Int. Cl.
*G11C 7/00* (2006.01)
*G06F 3/06* (2006.01)
*G06F 17/30* (2006.01)
*G11C 7/10* (2006.01)

(52) U.S. Cl.
CPC .............. *G11C 7/1012* (2013.01); *G06F 3/061* (2013.01); *G06F 3/0661* (2013.01); *G06F 3/0679* (2013.01); *G06F 3/0619* (2013.01); *G06F 3/0659* (2013.01); *G06F 3/0688* (2013.01); *G06F 17/30569* (2013.01)

(58) Field of Classification Search
CPC ..... G06F 3/061; G06F 3/0661; G06F 3/0659; G06F 3/0679; G06F 3/0688; G06F 3/0619; G06F 17/30569; G11C 7/1006
See application file for complete search history.

(56) References Cited

U.S. PATENT DOCUMENTS

| 5,586,297 | A  |   | 12/1996 | Bryg et al.         |         |
|-----------|----|---|---------|---------------------|---------|
| 5,586,315 | A  | * | 12/1996 | Narang et al.       |         |
| 6,128,709 | A  | * | 10/2000 | Autechaud et al.    | 711/151 |
| 6,292,844 | B1 | * | 9/2001  | Smyers et al.       | 710/5   |
| 6,751,129 | B1 |   | 6/2004  | Gongwer             |         |
| 7,720,821 | B1 | * | 5/2010  | Smyers et al.       | 707/690 |

(Continued)

FOREIGN PATENT DOCUMENTS

| KR | 20000026300 | 5/2000 |
| KR | 20010034476 | 4/2001 |

(Continued)

OTHER PUBLICATIONS

"Block Data Integrity", Kernel Trap, submitted Jun. 11, 2008, p. 9, http://kerneltrap.org/Linus/Block_Data_Integrity.*

(Continued)

*Primary Examiner* — Kevin Verbrugge
*Assistant Examiner* — Rocio Del Mar Perez-Velez
(74) *Attorney, Agent, or Firm* — Kunzler Law Group, PC

(57) ABSTRACT

Apparatuses, systems, and methods are disclosed for executing data transformations for a data storage device. A storage controller module controls a storage operation for a set of data within a data storage device. A transformation module determines to apply a data transformation to the set of data in response to a transformation indicator. A processing module applies the data transformation to the set of data internally on the data storage device prior to completing the storage operation.

24 Claims, 9 Drawing Sheets

(56) References Cited

U.S. PATENT DOCUMENTS

| | | | |
|---|---|---|---|
| 2007/0299883 A1* | 12/2007 | Feeney et al. | ............ 707/201 |
| 2008/0140724 A1* | 6/2008 | Flynn et al. | ............ 707/104.1 |
| 2008/0250195 A1 | 10/2008 | Chow | |
| 2010/0161888 A1 | 6/2010 | Eggleston | |
| 2012/0239868 A1 | 9/2012 | Ryan et al. | |

FOREIGN PATENT DOCUMENTS

| | | |
|---|---|---|
| KR | 20050024278 | 3/2005 |
| KR | 20060107728 | 10/2006 |

OTHER PUBLICATIONS

Ronald Weiss, "A Technical Overview of the Sun Oracle Exadata Storage Server and Database Machine", Sep. 2009 (Published Before Sep. 28, 2009).*

Erik Riedel, Garth Gibson, Christos Faloutsos, "Active Storage for Large-Scale Data Mining and Multimedia Applications", VLDB Conference, Aug. 1998.*

Sungchan Kim, Hyunok Oh, Chanik Park, Sangyeun Cho, Sang-Won Lee, "Fast, Energy Efficient Scan inside Flash Memory SSDs", ADMS Workshop, Sep. 2, 2011.*

Zhing, Mao, "EEL-6892-Virtual Computers", Lecture 18, University of Florida, Fall 2007, pp. 5.

"Hystor: Making SSDs the 'Survival of the Fittest' in High-Performance Storage Systems", pp. 14.

Petersen, Martin K., "DIF, DIX and Linux Data Integrity", Oracle, downloaded Jul. 2010, pp. 25, http://oss.oracle.com/projects/data-integrity/.

"Block Data Integrity", Kernel Trap, submitted Jun. 11, 2008, pp. 9, http://kerneltrap.org/Linus/Block_Data_Integrity.

Application No. PCT/US2011/053795, International Search Report and Written Opinion, May 4, 2012.

PCT/US2011/053795, International Preliminary Report on Patentability, Apr. 11, 2013.

U.S. Appl. No. 13/730,466, 2380.2.68, Office Action, Dec. 4, 2014.

"A Technical Overview of the Sun Oracle Exadata Storage Server and Database Machine", Oracle White Paper, pp. 29, Sep. 2009.

U.S. Appl. No. 13/730,466, 2380.2.68, Final Office Action, Jun. 10, 2015.

* cited by examiner ized data blocks. When a client is using data in a size smaller than a full data block, it must still access the full block. Providing access to data only in fixed sized blocks can be an inefficient use of system resources.
APPARATUS, SYSTEM, AND METHOD FOR DATA TRANSFORMATIONS WITHIN A DATA STORAGE DEVICE

CROSS-REFERENCES TO RELATED APPLICATIONS

This application claims priority to U.S. Provisional Patent Application No. 61/387,082 entitled "APPARATUS, SYSTEM, AND METHOD FOR DATA TRANSFORMATIONS WITHIN A DATA STORAGE DEVICE" and filed on Sep. 28, 2010 for David Flynn, et al., which is incorporated herein by reference.

FIELD

This invention relates to data storage and more particularly relates to transforming stored data.

BACKGROUND

Data storage devices typically access data in fixed sized data blocks. When a client is using data in a size smaller than a full data block, it must still access the full block. Providing access to data only in fixed sized blocks can be an inefficient use of system resources.

Transferring full data blocks when less than the full data blocks are being used increases traffic on data buses, which typically have limited bandwidth. Processing full data blocks can increase processing overhead for host devices and for clients using the data. Transferring and processing full data blocks when less than full data blocks are being used also consumes more host memory than would otherwise be used.

Even when a client is using full data blocks, processing large amounts of data can also be taxing on system resources. As data is processed, it is typically transferred on a data bus, stored in host memory, and processed using a host processor, all consuming resources of a host device.

SUMMARY

Methods of the present invention are presented for executing data transformations for a data storage device. In one embodiment, a method includes initiating a block I/O operation for a set of data within a data storage device. A method, in a further embodiment, includes determining to apply a data transformation to the set of data in response to a client request. In a certain embodiment, the client request defines the data transformation and includes a request to apply the data transformation. In another embodiment, a method includes applying the data transformation to the set of data in response to a determination that applying the data transformation satisfies an efficiency metric, and prior to completing the block I/O operation.

Apparatuses are presented for executing data transformations for a data storage device. In one embodiment, a storage controller module is configured to control a block I/O operation for a set of data within a data storage device. A transformation module, in one embodiment, is configured to determine to apply a data transformation to the set of data in response to a transformation indicator. In a certain embodiment, the transformation indicator is provided by a client request that identifies the block I/O operation and the data transformation. A processing module, in a further embodiment, is configured to apply the data transformation to the set of data internally on the data storage device prior to completing the block I/O operation in response to a determination that the data transformation is capable of being applied at a full data rate for a data pipeline configured to service the block I/O operation within the data storage device.

Systems are presented for executing data transformations for a data storage device. In one embodiment, a system includes a solid-state data storage device. The solid-state data storage device, in one embodiment, is in communication with a host device over a communications bus. A storage controller module, in a further embodiment, controls a block I/O operation for a set of data within the data storage device. A modification module, in another embodiment, determines to apply a data modification to the set of data in response to a client request that identifies the data modification. In certain embodiments, a processing module applies the data transformation to the set of data in response to a determination that applying the data modification satisfies an efficiency metric, and prior to completing the block I/O operation.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1:
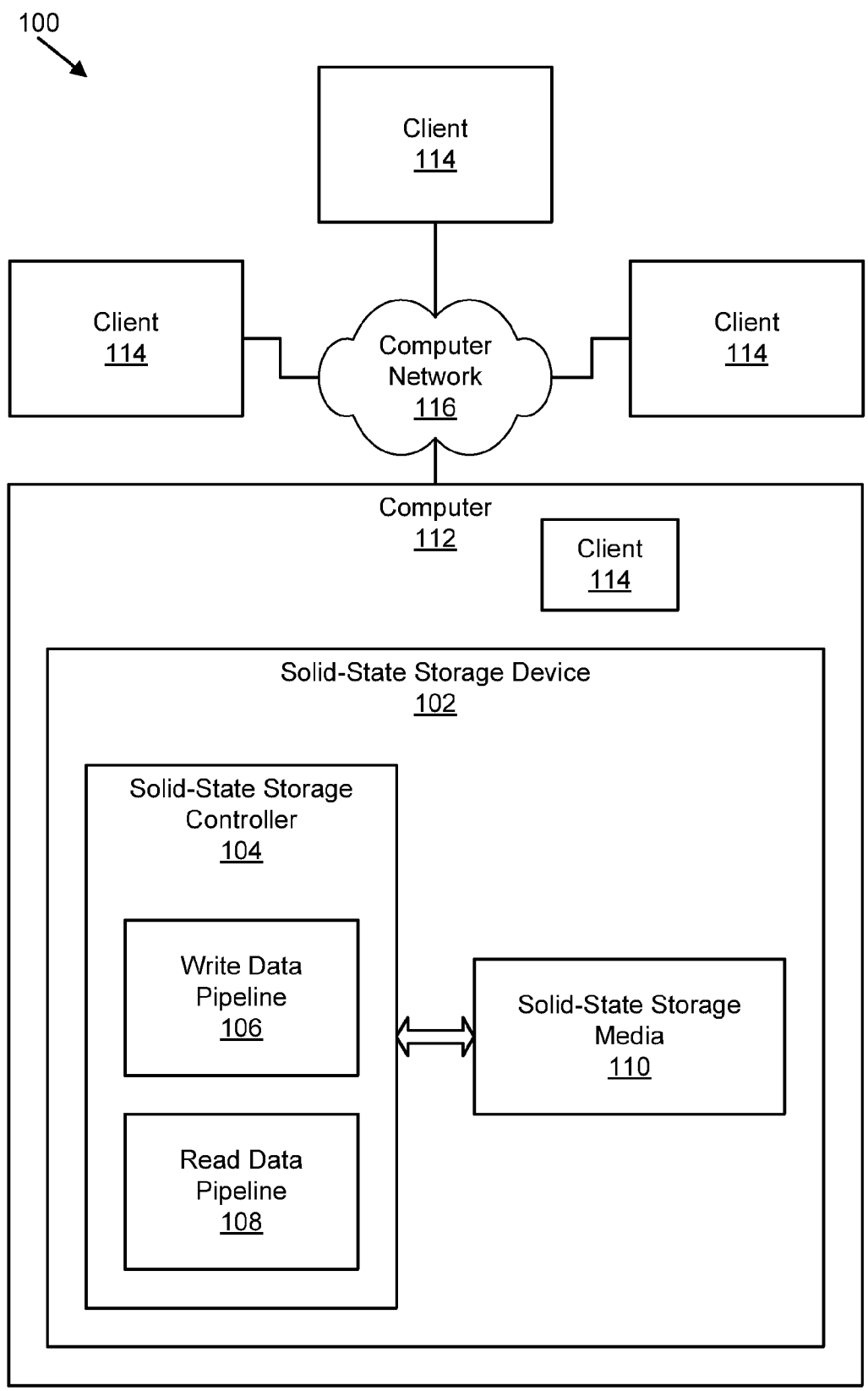
FIG. 1 is a schematic block diagram illustrating one embodiment of a system for transforming data in accordance with the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of computer readable program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of computer readable program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the computer readable program code may be stored and/or propagated on or in one or more computer readable medium(s).

The computer readable medium may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport computer readable program code for use by or in connection with an instruction execution system, apparatus, or device. Computer readable program code embodied on a computer readable signal medium may be transmitted using any appropriate medium, including but not limited to wireless, wireline, optical fiber cable, Radio Frequency (RF), or the like, or any suitable combination of the foregoing. In one embodiment, the computer readable medium may comprise a combination of one or more computer readable storage mediums and one or more computer readable signal mediums. For example, computer readable program code may be both propagated as an electro-magnetic signal through a fiber optic cable for execution by a processor and stored on RAM storage device for execution by the processor.

Computer readable program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The computer readable program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by computer readable program code. These computer readable program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The computer readable program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The computer readable program code may also be loaded onto a computer, other programmable data processing apparatus, or other devices to cause a series of operational steps to be performed on the computer, other programmable apparatus or other devices to produce a computer implemented process such that the program code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer readable program code.

Solid-State Storage System

FIG. 1 is a schematic block diagram illustrating one embodiment of a system 100 for improving performance in a solid-state storage device in accordance with the present invention. The system 100 includes a solid-state storage device 102, a solid-state storage controller 104, a write data pipeline 106, a read data pipeline 108, a solid-state storage media 110, a computer 112, a client 114, and a computer network 116, which are described below.

The system 100 includes at least one solid-state storage device 102. In another embodiment, the system 100 includes two or more solid-state storage devices 102. Each solid-state storage device 102 may include non-volatile, solid-state storage media 110, such as flash memory, nano random access memory ("nano RAM or NRAM"), nanocrystal wire-based memory, silicon-oxide based sub-10 nanometer process memory, graphene memory, Silicon-Oxide-Nitride-Oxide-Silicon ("SONOS"), Resistive random-access memory ("RRAM"), programmable metallization cell ("PMC"), conductive-bridging RAM ("CBRAM"), magneto-resistive RAM ("MRAM"), dynamic RAM ("DRAM"), phase change RAM ("PRAM"), etc. The solid-state storage device 102 is described in more detail with respect to FIGS. 2 and 3. The solid-state storage device 102 is depicted in a computer 112 connected to a client 114 through a computer network 116.

In one embodiment, the solid-state storage device 102 is internal to the computer 112 and is connected using a system communications bus, such as a peripheral component interconnect express ("PCI-e") bus, a Serial Advanced Technology Attachment ("serial ATA") bus, or the like. In another embodiment, the solid-state storage device 102 is external to the computer 112 and is connected using an external communications bus, such as a universal serial bus ("USB") connection, an Institute of Electrical and Electronics Engineers ("IEEE") 1394 bus ("FireWire"), or the like. In other embodiments, the solid-state storage device 102 is connected to the computer 112 using a peripheral component interconnect ("PCI") express bus using external electrical or optical bus extension or bus networking solution such as Infiniband or PCI Express Advanced Switching ("PCIe-AS"), or the like. In certain embodiments, one or more peer hardware devices may be in communication with the computer 112 over the same communications bus, such as a graphics processing unit ("GPU") on a PCI-e bus or the like.

In various embodiments, the solid-state storage device 102 may be in the form of a dual-inline memory module ("DIMM"), a daughter card, or a micro-module. In another embodiment, the solid-state storage device 102 is an element within a rack-mounted blade. In another embodiment, the solid-state storage device 102 is contained within a package that is integrated directly onto a higher level assembly (e.g. mother board, lap top, graphics processor). In another embodiment, individual components comprising the solid-state storage device 102 are integrated directly onto a higher level assembly without intermediate packaging.

The solid-state storage device 102 includes one or more solid-state storage controllers 104, each may include a write data pipeline 106 and a read data pipeline 108 and each includes a solid-state storage media 110, which are described in more detail below with respect to FIGS. 2 and 3. The solid-state storage controller 104, in certain embodiments, comprises a solid-state storage controller module, that may comprise logic hardware of the data storage device 102 or a combination of both hardware of the data storage device 102 and a device driver executing on the computer 112.

The system 100 includes one or more computers 112 connected to the solid-state storage device 102. A computer 112 may be a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a computer 112 may be a client and the solid-state storage device 102 operates autonomously to service data requests sent from the computer 112. In this embodiment, the computer 112 and solid-state storage device 102 may be connected using a computer network, system bus, or other communication means suitable for connection between a computer 112 and an autonomous solid-state storage device 102. The computer 112 is one embodiment of a host device for the solid-state storage device 102.

In one embodiment, the system 100 includes one or more clients 114 connected to one or more computers 112 through one or more computer networks 116. A client 114 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, the client 114 operates within the computer 112. The client 114 may be an application, a server, an applet, a thread, a driver, a database management system, a daemon, or the like. The computer network 116 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 116 may also include a network from the IEEE 802 family of network technologies, such Ethernet, token ring, WiFi, WiMax, and the like.

The computer network 116 may include servers, switches, routers, cabling, radios, and other equipment used to facilitate networking computers 112 and clients 114. In one embodiment, the system 100 includes multiple computers 112 that communicate as peers over a computer network 116. In another embodiment, the system 100 includes multiple solid-state storage devices 102 that communicate as peers over a computer network 116. One of skill in the art will recognize other computer networks 116 comprising one or more computer networks 116 and related equipment with single or redundant connection between one or more clients 114 or other computer with one or more solid-state storage devices 102 or one or more solid-state storage devices 102 connected to one or more computers 112. In one embodiment, the system 100 includes two or more solid-state storage devices 102 connected through the computer network 116 to a client 114 without a computer 112.

Solid-State Storage Device

Figure 2:
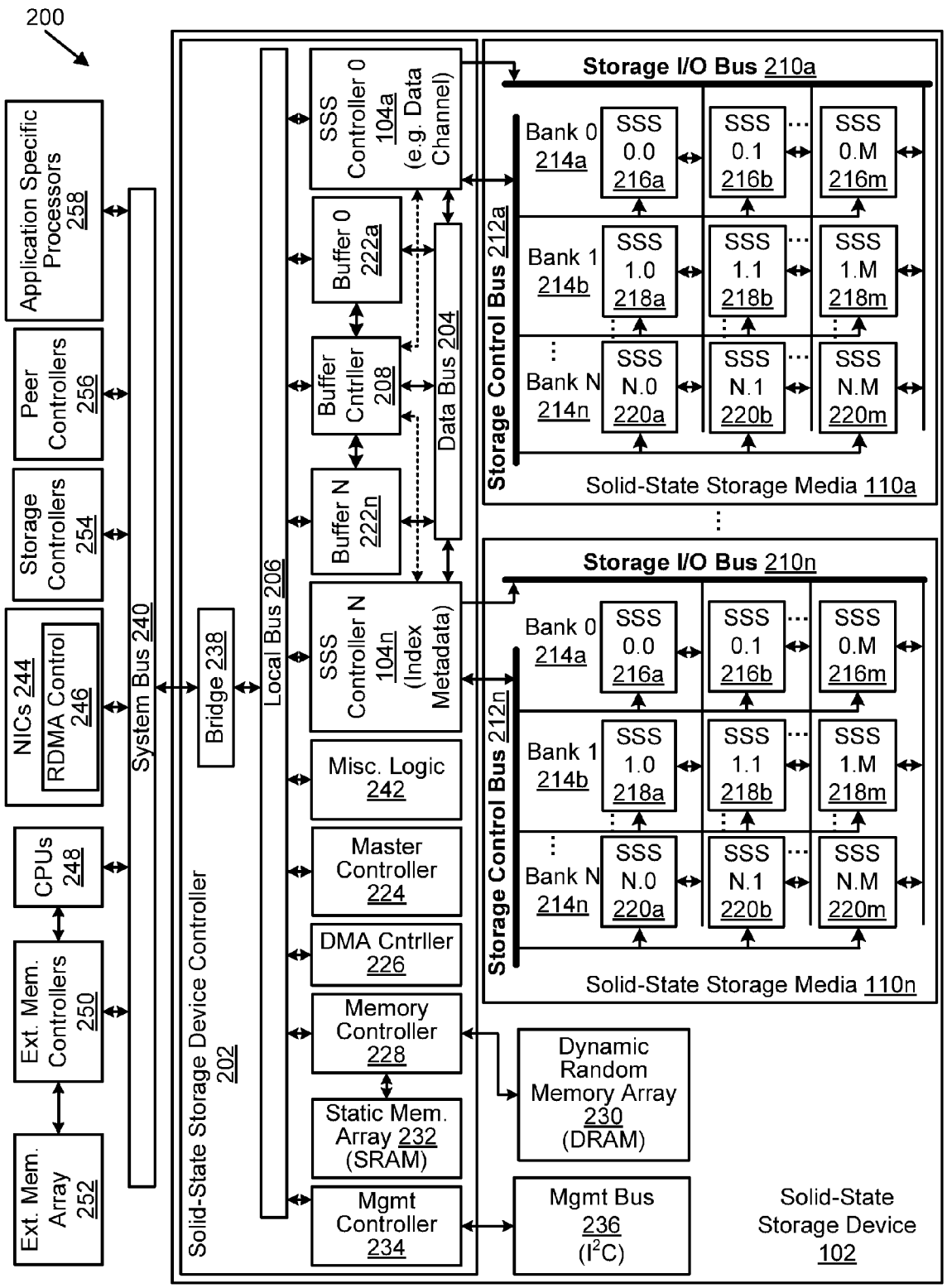
FIG. 2 is a schematic block diagram illustrating one embodiment of a solid-state storage device controller for transforming data in accordance with the present invention.

FIG. 2 is a schematic block diagram illustrating one embodiment 200 of a solid-state storage device controller 202 that includes a write data pipeline 106 and a read data pipeline 108 in a solid-state storage device 102 in accordance with the present invention. The solid-state storage device controller 202 may be embodied as hardware, as software, or as a combination of hardware and software. The solid-state storage device controller 202 may include a number of solid-state storage controllers 0-N 104a-n, each controlling solid-state storage media 110.

In the depicted embodiment, two solid-state controllers are shown: solid-state controller 0 104a and solid-state storage controller N 104n, and each controls solid-state storage media 110a-n. In the depicted embodiment, solid-state storage controller 0 104a controls a data channel so that the attached solid-state storage media 110a stores data. Solid-state storage controller N 104n controls an index metadata channel associated with the stored data and the associated solid-state storage media 110n stores index metadata. In an alternate embodiment, the solid-state storage device controller 202 includes a single solid-state controller 104a with a single solid-state storage media 110a. In another embodiment, there are a plurality of solid-state storage controllers 104a-n and associated solid-state storage media 110a-n. In one embodiment, one or more solid-state controllers 104a-104n-1, coupled to their associated solid-state storage media 110a-110n-1, control data while at least one solid-state storage controller 104n, coupled to its associated solid-state storage media 110n, controls index metadata.

In one embodiment, at least one solid-state controller 104 is field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline 106 and a read data pipeline 108, which are describe further in relation to FIG. 3. In another embodiment, at least one solid-state storage controller 104 is made up of a combination FPGA, ASIC, and custom logic components.

Solid-State Storage

The solid-state storage media 110 is an array of non-volatile solid-state storage elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the solid-state storage media 110, data cannot be read from the solid-state storage media 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A solid-state storage element (e.g. SSS 0.0 216a) is typically configured as a chip (a package of one or more dies) or a die on a circuit board. As depicted, a solid-state storage element (e.g. 216a) operates independently or semi-independently of other solid-state storage elements (e.g. 218a) even if these several elements are packaged together in a chip package, a stack of chip packages, or some other package element. As depicted, a row of solid-state storage elements 216a, 216b, 216m is designated as a bank 214.

As depicted, there may be "n" banks 214a-n and "m" solid-state storage elements 216a-m, 218a-m, 220a-m per bank in an array of n×m solid-state storage elements 216, 218, 220 in a solid-state storage media 110. Of course different embodiments may include different values for n and m. In one embodiment, the solid-state storage media 110a includes twenty solid-state storage elements 216, 218, 220 per bank 214 with eight banks 214. In one embodiment, the solid-state storage media 110a includes twenty four solid-state storage elements 216, 218, 220 per bank 214 with eight banks 214. In addition to the n×m storage elements 216, 218, 220, one or more additional columns (P) may also be addressed and operated in parallel with other solid-state storage elements 216a,

216b, 216m for one or more rows. The added P columns in one embodiment, store parity data for the portions of an ECC chunk (i.e. an ECC codeword) that span m storage elements for a particular bank. In one embodiment, each solid-state storage element 216, 218, 220 is comprised of single-level cell ("SLC") devices. In another embodiment, each solid-state storage element 216, 218, 220 is comprised of multi-level cell ("MLC") devices.

In one embodiment, solid-state storage elements that share a common storage I/O bus 210a (e.g. 216b, 218b, 220b) are packaged together. In one embodiment, a solid-state storage element 216, 218, 220 may have one or more dies per chip with one or more chips stacked vertically and each die may be accessed independently. In another embodiment, a solid-state storage element (e.g. SSS 0.0 216a) may have one or more virtual dies per die and one or more dies per chip and one or more chips stacked vertically and each virtual die may be accessed independently. In another embodiment, a solid-state storage element SSS 0.0 216a may have one or more virtual dies per die and one or more dies per chip with some or all of the one or more dies stacked vertically and each virtual die may be accessed independently.

In one embodiment, two dies are stacked vertically with four stacks per group to form eight storage elements (e.g. SSS 0.0-SSS 8.0) 216a-220a, each in a separate bank 214a-n. In another embodiment, 24 storage elements (e.g. SSS 0.0-SSS 0.24) 216 form a logical bank 214a so that each of the eight logical banks has 24 storage elements (e.g. SSS0.0-SSS 8.24) 216, 218, 220. Data is sent to the solid-state storage media 110 over the storage I/O bus 210 to all storage elements of a particular group of storage elements (SSS 0.0-SSS 8.0) 216a, 218a, 220a. The storage control bus 212a is used to select a particular bank (e.g. Bank 0 214a) so that the data received over the storage I/O bus 210 connected to all banks 214 is written just to the selected bank 214a.

In a one embodiment, the storage I/O bus 210 is comprised of one or more independent I/O buses ("IIOBa-m" comprising 210a.a-m, 210n.a-m) wherein the solid-state storage elements within each column share one of the independent I/O buses that accesses each solid-state storage element 216, 218, 220 in parallel so that all banks 214 are accessed simultaneously. For example, one channel of the storage I/O bus 210 may access a first solid-state storage element 216a, 218a, 220a of each bank 214a-n simultaneously. A second channel of the storage I/O bus 210 may access a second solid-state storage element 216b, 218b, 220b of each bank 214a-n simultaneously. Each row of solid-state storage element 216a, 216b, 216m is accessed simultaneously. In one embodiment, where solid-state storage elements 216, 218, 220 are multi-level (physically stacked), all physical levels of the solid-state storage elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214a-n are independently selected using the storage control bus 212. In one embodiment, a bank 214 is selected using a chip enable or chip select. Where both chip select and chip enable are available, the storage control bus 212 may select one level of a multi-level solid-state storage element 216, 218, 220. In other embodiments, other commands are used by the storage control bus 212 to individually select one level of a multi-level solid-state storage element 216, 218, 220. Solid-state storage elements 216, 218, 220 may also be selected through a combination of control and of address information transmitted on storage I/O bus 210 and the storage control bus 212.

In one embodiment, each solid-state storage element 216, 218, 220 is partitioned into erase blocks and each erase block is partitioned into pages. An erase block on a solid-state storage element 216, 218 220 may be called a physical erase block or "PEB." A typical page is 2000 bytes ("2 kB"). In one example, a solid-state storage element (e.g. SSS 0.0) includes two registers and can program two pages so that a two-register solid-state storage element 216, 218, 220 has a capacity of 4 kB. A bank 214 of 20 solid-state storage elements 216a, 216b, 216m would then have an 80 kB capacity of pages accessed with the same address going out the channels of the storage I/O bus 210.

This group of pages in a bank 214 of solid-state storage elements 216a, 216b, 216m of 80 kB may be called a logical page or virtual page. Similarly, an erase block of each storage element 216a-m of a bank 214a may be grouped to form a logical erase block or a virtual erase block. In one embodiment, an erase block of pages within a solid-state storage element 216, 218, 220 is erased when an erase command is received within a solid-state storage element 216, 218, 220. Whereas the size and number of erase blocks, pages, planes, or other logical and physical divisions within a solid-state storage element 216, 218, 220 are expected to change over time with advancements in technology, it is to be expected that many embodiments consistent with new configurations are possible and are consistent with the general description herein.

Typically, when a packet is written to a particular location within a solid-state storage element 216, 218, 220, wherein the packet is intended to be written to a location within a particular page which is specific to a particular physical erase block of a particular storage element of a particular bank, a physical address is sent on the storage I/O bus 210 and followed by the packet. The physical address contains enough information for the solid-state storage element 216, 218, 220 to direct the packet to the designated location within the page. Since all storage elements in a column of storage elements (e.g. SSS 0.0-SSS N.0 216a, 218a, 220a) are accessed simultaneously by the appropriate bus within the storage I/O bus 210a.a, to reach the proper page and to avoid writing the data packet to similarly addressed pages in the column of storage elements (SSS 0.0-SSS N.0 216a, 218a, 220a), the bank 214a that includes the solid-state storage element SSS 0.0 216a with the correct page where the data packet is to be written is simultaneously selected by the storage control bus 212.

Similarly, satisfying a read command on the storage I/O bus 210 requires a simultaneous signal on the storage control bus 212 to select a single bank 214a and the appropriate page within that bank 214a. In one embodiment, a read command reads an entire page, and because there are multiple solid-state storage elements 216a, 216b, 216m in parallel in a bank 214, an entire logical page is read with a read command. However, the read command may be broken into subcommands, as will be explained below with respect to bank interleave. A logical page may also be accessed in a write operation.

An erase block erase command may be sent out to erase an erase block over the storage I/O bus 210 with a particular erase block address to erase a particular erase block. Typically, an erase block erase command may be sent over the parallel paths of the storage I/O bus 210 to erase a logical erase block, each with a particular erase block address to erase a particular erase block. Simultaneously a particular bank (e.g. Bank 0 214a) is selected over the storage control bus 212 to prevent erasure of similarly addressed erase blocks in all of the banks (Banks 1-N 214b-n). Alternatively, no particular bank (e.g. Bank 0 214a) is selected over the storage control bus 212 to enable erasure of similarly addressed erase blocks in all of the banks (Banks 1-N 214b-n) simultaneously. Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, packets are written sequentially to the solid-state storage media 110. For example, packets are streamed to the storage write buffers of a bank 214a of storage elements 216 and when the buffers are full, the packets are programmed to a designated logical page. Packets then refill the storage write buffers and, when full, the packets are written to the next logical page. The next logical page may be in the same bank 214a or another bank (e.g. 214b). This process continues, logical page after logical page, typically until a logical erase block is filled. In another embodiment, the streaming may continue across logical erase block boundaries with the process continuing, logical erase block after logical erase block.

In a read, modify, write operation, data packets associated with requested data are located and read in a read operation. Data segments of the modified requested data that have been modified are not written to the location from which they are read. Instead, the modified data segments are again converted to data packets and then written sequentially to the next available location in the logical page currently being written. The index entries for the respective data packets are modified to point to the packets that contain the modified data segments. The entry or entries in the index for data packets associated with the same requested data that have not been modified will include pointers to original location of the unmodified data packets. Thus, if the original requested data is maintained, for example to maintain a previous version of the requested data, the original requested data will have pointers in the index to all data packets as originally written. The new requested data will have pointers in the index to some of the original data packets and pointers to the modified data packets in the logical page that is currently being written.

In a copy operation, the index includes an entry for the original requested data mapped to a number of packets stored in the solid-state storage media 110. When a copy is made, new copy of the requested data is created and a new entry is created in the index mapping the new copy of the requested data to the original packets. The new copy of the requested data is also written to the solid-state storage media 110 with its location mapped to the new entry in the index. The new copy of the requested data packets may be used to identify the packets within the original requested data that are referenced in case changes have been made in the original requested data that have not been propagated to the copy of the requested data and the index is lost or corrupted.

Beneficially, sequentially writing packets facilitates a more even use of the solid-state storage media 110 and allows the solid-storage device controller 202 to monitor storage hot spots and level usage of the various logical pages in the solid-state storage media 110. Sequentially writing packets also facilitates a powerful, efficient garbage collection system, which is described in detail below. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222a-n, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the computer 112 or may be other devices.

Typically the solid-state storage controller(s) 104 communicate data to the solid-state storage media 110 over a storage I/O bus 210. In a typical embodiment where the solid-state storage is arranged in banks 214 and each bank 214 includes multiple storage elements 216a, 216b, 216m accessed in parallel, the storage I/O bus 210 is an array of busses, one for each column of storage elements 216, 218, 220 spanning the banks 214. As used herein, the term "storage I/O bus" may refer to one storage I/O bus 210 or an array of data independent busses 204. In one embodiment, each storage I/O bus 210 accessing a column of storage elements (e.g. 216a, 218a, 220a) may include a logical-to-physical mapping for storage divisions (e.g. erase blocks) accessed in a column of storage elements 216a, 218a, 220a. This mapping (or bad block remapping) allows a logical address mapped to a physical address of a storage division to be remapped to a different storage division if the first storage division fails, partially fails, is inaccessible, or has some other problem.

Data may also be communicated to the solid-state storage controller(s) 104 from a requesting device 155 through the system bus 240, bridge 238, local bus 206, buffer(s) 222, and finally over a data bus 204. The data bus 204 typically is connected to one or more buffers 222a-n controlled with a buffer controller 208. The buffer controller 208 typically controls transfer of data from the local bus 206 to the buffers 222 and through the data bus 204 to the pipeline input buffer 306 and output buffer 330. The buffer controller 208 typically controls how data arriving from a requesting device can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically the data is transferred from the local bus 206 to one or more data buffers 222 as directed by the master controller 224 and the buffer controller 208. The data then flows out of the buffer(s) 222 to the data bus 204, through a solid-state controller 104, and on to the solid-state storage media 110 such as NAND flash or other storage media. In one embodiment, data and associated out-of-band metadata ("metadata") arriving with the data is communicated using one or more data channels comprising one or more solid-state storage controllers 104a-104n-1 and associated solid-state storage media 110a-110n-1 while at least one channel (solid-state storage controller 104n, solid-state storage media 110n)

is dedicated to in-band metadata, such as index information and other metadata generated internally to the solid-state storage device 102.

The local bus 206 is typically a bidirectional bus or set of busses that allows for communication of data and commands between devices internal to the solid-state storage device controller 202 and between devices internal to the solid-state storage device 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204, 210 and bridges 238.

The system bus 240 is typically a bus of a computer 112 or other device in which the solid-state storage device 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), FireWire, Fiber Channel, USB, PCIe-AS, or the like. The solid-state storage device 102 may be packaged to fit internally to a device or as an externally connected device.

The solid-state storage device controller 202 includes a master controller 224 that controls higher-level functions within the solid-state storage device 102. The master controller 224, in various embodiments, controls data flow by interpreting object requests and other requests, directs creation of indexes to map object identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 232 (static random access memory "SRAM"), etc. In one embodiment, the local memory is controlled using the master controller 224. In another embodiment, the master controller 224 accesses the local memory via a memory controller 228. In another embodiment, the master controller 224 runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. One skilled in the art will recognize many embodiments for the master controller 224.

In one embodiment, where the storage device/solid-state storage device controller 202 manages multiple data storage devices/solid-state storage media 110*a-n*, the master controller 224 divides the work load among internal controllers, such as the solid-state storage controllers 104*a-n*. For example, the master controller 224 may divide an object to be written to the data storage devices (e.g. solid-state storage media 110*a-n*) so that a portion of the object is stored on each of the attached data storage devices. This feature is a performance enhancement allowing quicker storage and access to an object. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224, which manages objects, emulates block storage such that a computer 112 or other device connected to the storage device/solid-state storage device 102 views the storage device/solid-state storage device 102 as a block storage device and sends data to specific physical addresses in the storage device/solid-state storage device 102. The master controller 224 then divides up the blocks and stores the data blocks as it would objects. The master controller 224 then maps the blocks and physical address sent with the block to the actual locations determined by the master controller 224. The mapping is stored in the object index. Typically, for block emulation, a block device application program interface ("API") is provided in a driver in the computer 112, client 114, or other device wishing to use the storage device/solid-state storage device 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a client 114 may have access to the computer network 116 through an I/O memory driver using a standard stack API and operating in conjunction with NICs 244.

In one embodiment, the master controller 224 is also a redundant array of independent drive ("RAID") controller. Where the data storage device/solid-state storage device 102 is networked with one or more other data storage devices/solid-state storage devices 102, the master controller 224 may be a RAID controller for single tier RAID, multi-tier RAID, progressive RAID, etc. The master controller 224 also allows some objects to be stored in a RAID array and other objects to be stored without RAID. In another embodiment, the master controller 224 may be a distributed RAID controller element. In another embodiment, the master controller 224 may comprise many RAID, distributed RAID, and other functions as described elsewhere. In one embodiment, the master controller 224 controls storage of data in a RAID-like structure where parity information is stored in one or more storage elements 216, 218, 220 of a logical page where the parity information protects data stored in the other storage elements 216, 218, 220 of the same logical page.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via the computer network 116) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/solid-state storage device 102 may appear as a storage device connected through a SCSI bus, Internet SCSI ("iSCSI"), fiber channel, etc. Meanwhile the storage device/solid-state storage device 102 may autonomously manage objects and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/solid-state storage device 102 to be partitioned into multiple virtual devices and allows partition-based media encryption. In yet another embodiment, the master controller 224 supports a solid-state storage controller 104 with advanced, multi-bit ECC correction. One of skill in the art will recognize other features and functions of a master controller 224 in a storage controller 202, or more specifically in a solid-state storage device 102.

In one embodiment, the solid-state storage device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the object index is stored in memory 230, 232 and then periodically off-loaded to a channel of the solid-state storage media 110n or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/solid-state storage device 102 and one or more external memory controllers 250 and associated external memory arrays 252 and CPUs 248. Note that the external memory controllers 250 and external memory arrays 252 are called external because they are external to the storage device/solid-state storage device 102. In addition the DMA controller 226 may also control RDMA operations with requesting devices through a NIC 244 and associated RDMA controller 246.

In one embodiment, the solid-state storage device controller 202 includes a management controller 234 connected to a management bus 236. Typically the management controller 234 manages environmental metrics and status of the storage device/solid-state storage device 102. The management controller 234 may monitor device temperature, fan speed, power supply settings, etc. over the management bus 236.

The management controller 234 may support the reading and programming of erasable programmable read only memory ("EEPROM") for storage of FPGA code and controller software. Typically the management bus 236 is connected to the various components within the storage device/solid-state storage device 102. The management controller 234 may communicate alerts, interrupts, etc. over the local bus 206 or may include a separate connection to a system bus 240 or other bus. In one embodiment the management bus 236 is an Inter-Integrated Circuit ("I2C") bus. One of skill in the art will recognize other related functions and uses of a management controller 234 connected to components of the storage device/solid-state storage device 102 by a management bus 236.

In one embodiment, the solid-state storage device controller 202 includes miscellaneous logic 242 that may be customized for a specific application. Typically where the solid-state device controller 202 or master controller 224 is/are configured using a FPGA or other configurable controller, custom logic may be included based on a particular application, customer requirement, storage requirement, etc.

Data Pipeline

Figure 3:
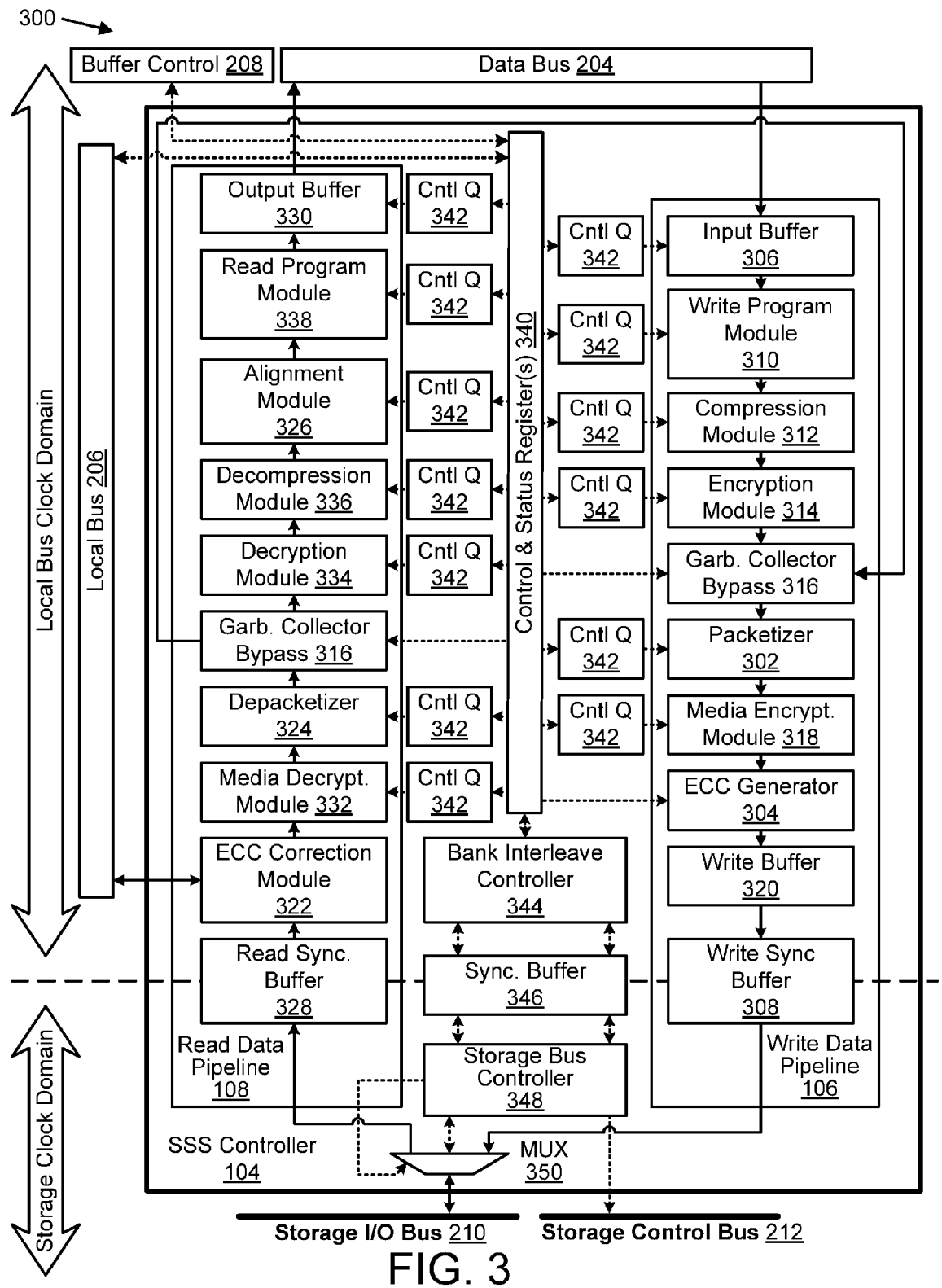
FIG. 3 is a schematic block diagram illustrating one embodiment of a solid-state storage controller with a write data pipeline and a read data pipeline in a solid-state storage device in accordance with the present invention.

FIG. 3 is a schematic block diagram illustrating one embodiment 300 of a solid-state storage controller 104 with a write data pipeline 106 and a read data pipeline 108 in a solid-state storage device 102 in accordance with the present invention. The embodiment 300 includes a data bus 204, a local bus 206, and buffer control 208, which are substantially similar to those described in relation to the solid-state storage device controller 202 of FIG. 2. The write data pipeline 106 includes a packetizer 302 and an error-correcting code ("ECC") generator 304. In other embodiments, the write data pipeline 106 includes an input buffer 306, a write synchronization buffer 308, a write program module 310, a compression module 312, an encryption module 314, a garbage collector bypass 316 (with a portion within the read data pipeline 108), a media encryption module 318, and a write buffer 320. The read data pipeline 108 includes a read synchronization buffer 328, an ECC correction module 322, a depacketizer 324, an alignment module 326, and an output buffer 330. In other embodiments, the read data pipeline 108 may include a media decryption module 332, a portion of the garbage collector bypass 316, a decryption module 334, a decompression module 336, and a read program module 338. The solid-state storage controller 104 may also include control and status registers 340 and control queues 342, a bank interleave controller 344, a synchronization buffer 346, a storage bus controller 348, and a multiplexer ("MUX") 350. The components of the solid-state controller 104 and associated write data pipeline 106 and read data pipeline 108 are described below. In other embodiments, synchronous solid-state storage media 110 may be used and synchronization buffers 308 328 may be eliminated.

Write Data Pipeline

The write data pipeline 106 includes a packetizer 302 that receives a data or metadata segment to be written to the solid-state storage, either directly or indirectly through another write data pipeline 106 stage, and creates one or more packets sized for the solid-state storage media 110. The data or metadata segment is typically part of a data structure such as an object, but may also include an entire data structure. In another embodiment, the data segment is part of a block of data, but may also include an entire block of data. Typically, a set of data such as a data structure is received from a computer such as the host device 114, or other computer or device and is transmitted to the solid-state storage device 102 in data segments streamed to the solid-state storage device 102 and/or the host device 114. A data segment may also be known by another name, such as data parcel, but as referenced herein includes all or a portion of a data structure or data block.

Each data structure is stored as one or more packets. Each data structure may have one or more container packets. Each packet contains a header. The header may include a header type field. Type fields may include data, attribute, metadata, data segment delimiters (multi-packet), data structures, data linkages, and the like. The header may also include information regarding the size of the packet, such as the number of bytes of data included in the packet. The length of the packet may be established by the packet type. The header may include information that establishes the relationship of the packet to a data structure. An example might be the use of an offset in a data packet header to identify the location of the data segment within the data structure. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the data structure to which the packet belongs. For example, the header may include an object identifier or other data structure identifier and offset that indicate the data segment, object, data structure or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the data structure when reconstructing the data segment or data structure. The header may include a header type field. Type fields may include data, data structure attributes, metadata, data segment delimiters (multi-packet), data structure types, data structure linkages, and the like. One of skill in the art will recognize other information that may be included in a header added to data or metadata by a packetizer 302 and other information that may be added to a packet.

The write data pipeline 106 includes an ECC generator 304 that that generates one or more error-correcting codes ("ECC") for the one or more packets received from the packetizer 302. The ECC generator 304 typically uses an error correcting algorithm to generate ECC check bits which are stored with the one or more data packets. The ECC codes generated by the ECC generator 304 together with the one or more data packets associated with the ECC codes comprise an ECC chunk. The ECC data stored with the one or more data packets is used to detect and to correct errors introduced into the data through transmission and storage. In one embodiment, packets are streamed into the ECC generator 304 as un-encoded blocks of length N. A syndrome of length S is calculated, appended and output as an encoded block of length N+S. The value of N and S are dependent upon the characteristics of the algorithm which is selected to achieve specific performance, efficiency, and robustness metrics. In one embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In one embodiment, ECC algorithms are not dynamically modified. In one embodiment, the ECC data stored with the data packets is robust enough to correct errors in more than two bits.

Beneficially, using a robust ECC algorithm allowing more than single bit correction or even double bit correction allows the life of the solid-state storage media 110 to be extended. For example, if flash memory is used as the storage medium in the solid-state storage media 110, the flash memory may be written approximately 100,000 times without error per erase cycle. This usage limit may be extended using a robust ECC algorithm. Having the ECC generator 304 and corresponding ECC correction module 322 onboard the solid-state storage device 102, the solid-state storage device 102 can internally correct errors and has a longer useful life than if a less robust ECC algorithm is used, such as single bit correction. However, in other embodiments the ECC generator 304 may use a less robust algorithm and may correct single-bit or double-bit errors. In another embodiment, the solid-state storage device 102 may comprise less reliable storage such as multi-level cell ("MLC") flash in order to increase capacity, which storage may not be sufficiently reliable without more robust ECC algorithms.

In one embodiment, the write pipeline 106 includes an input buffer 306 that receives a data segment to be written to the solid-state storage media 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically when the write data pipeline 106 does not include an input buffer 306, a buffering function is performed elsewhere, such as in the solid-state storage device 102, but outside the write data pipeline 106, in the host device 114, such as within a network interface card ("NIC"), or at another device, for example when using remote direct memory access ("RDMA").

In another embodiment, the write data pipeline 106 also includes a write synchronization buffer 308 that buffers packets received from the ECC generator 304 prior to writing the packets to the solid-state storage media 110. The write synch buffer 308 is located at a boundary between a local clock domain and a solid-state storage clock domain and provides buffering to account for the clock domain differences. In other embodiments, synchronous solid-state storage media 110 may be used and synchronization buffers 308 328 may be eliminated.

In one embodiment, the write data pipeline 106 also includes a media encryption module 318 that receives the one or more packets from the packetizer 302, either directly or indirectly, and encrypts the one or more packets using an encryption key unique to the solid-state storage device 102 prior to sending the packets to the ECC generator 304. Typically, the entire packet is encrypted, including the headers. In another embodiment, headers are not encrypted. In this document, encryption key is understood to mean a secret encryption key that is managed externally from a solid-state storage controller 104.

The media encryption module 318 and corresponding media decryption module 332 provide a level of security for data stored in the solid-state storage media 110. For example, where data is encrypted with the media encryption module 318, if the solid-state storage media 110 is connected to a different solid-state storage controller 104, solid-state storage device 102, or server, the contents of the solid-state storage media 110 typically could not be read without use of the same encryption key used during the write of the data to the solid-state storage media 110 without significant effort.

In a typical embodiment, the solid-state storage device 102 does not store the encryption key in non-volatile storage and allows no external access to the encryption key. The encryption key is provided to the solid-state storage controller 104 during initialization. The solid-state storage device 102 may use and store a non-secret cryptographic nonce that is used in conjunction with an encryption key. A different nonce may be stored with every packet. Data segments may be split between multiple packets with unique nonces for the purpose of improving protection by the encryption algorithm.

The encryption key may be received from a host device 114, a server, key manager, or other device that manages the encryption key to be used by the solid-state storage controller 104. In another embodiment, the solid-state storage media 110 may have two or more partitions and the solid-state storage controller 104 behaves as though it was two or more solid-state storage controllers 104, each operating on a single partition within the solid-state storage media 110. In this embodiment, a unique media encryption key may be used with each partition.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption keys used by the encryption module 314 to encrypt data may not be common to all data stored within the solid-state storage device 102 but may vary on an per data structure basis and received in conjunction with receiving data segments as described below. For example, an encryption key for a data segment to be encrypted by the encryption module 314 may be received with the data segment or may be received as part of a command to write a data structure to which the data segment belongs. The solid-state storage device 102 may use and store a non-secret cryptographic nonce in each data structure packet that is used in conjunction with the encryption key. A different nonce may be stored with every packet. Data segments may be split between multiple packets with unique nonces for the purpose of improving protection by the encryption algorithm.

The encryption key may be received from a host device 114, a computer, key manager, or other device that holds the encryption key to be used to encrypt the data segment. In one embodiment, encryption keys are transferred to the solid-state storage controller 104 from one of a solid-state storage device 102, a computer, a host device 114, or other external agent which has the ability to execute industry standard methods to securely transfer and protect private and public keys.

In one embodiment, the encryption module 314 encrypts a first packet with a first encryption key received in conjunction with the packet and encrypts a second packet with a second encryption key received in conjunction with the second packet. In another embodiment, the encryption module 314 encrypts a first packet with a first encryption key received in conjunction with the packet and passes a second data packet on to the next stage without encryption. Beneficially, the encryption module 314 included in the write data pipeline 106 of the solid-state storage device 102 allows data structure-by-data structure or segment-by-segment data encryption without a single file system or other external system to keep track of the different encryption keys used to store corresponding data structures or data segments. Each requesting device 155 or related key manager independently manages encryption keys used to encrypt only the data structures or data segments sent by the requesting device 155.

In one embodiment, the encryption module 314 may encrypt the one or more packets using an encryption key unique to the solid-state storage device 102. The encryption module 314 may perform this media encryption independently, or in addition to the encryption described above. Typically, the entire packet is encrypted, including the headers. In another embodiment, headers are not encrypted. The media encryption by the encryption module 314 provides a level of security for data stored in the solid-state storage media 110. For example, where data is encrypted with media encryption unique to the specific solid-state storage device 102 if the solid-state storage media 110 is connected to a different solid-state storage controller 104, solid-state storage device 102, or host device 114, the contents of the solid-state storage media 110 typically could not be read without use of the same encryption key used during the write of the data to the solid-state storage media 110 without significant effort.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the solid-state storage device 102 is beneficial so that the host device 114 or other devices writing data to the solid-state storage device 102 may each specify a compression routine or so that one can specify a compression routine while another specifies no compression. Selection of compression routines may also be selected according to default settings on a per data structure type or data structure class basis. For example, a first data structure of a specific data structure may be able to override default compression routine settings and a second data structure of the same data structure class and data structure type may use the default compression routine and a third data structure of the same data structure class and data structure type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular section of storage may be recovered. This determination may be due to a lack of available storage capacity, the percentage of data marked as invalid reaching a threshold, a consolidation of valid data, an error detection rate for that section of storage reaching a threshold, or improving performance based on data distribution, etc. Numerous factors may be considered by a garbage collection algorithm to determine when a section of storage is to be recovered.

Once a section of storage has been marked for recovery, valid packets in the section typically must be relocated. The garbage collector bypass 316 allows packets to be read into the read data pipeline 108 and then transferred directly to the write data pipeline 106 without being routed out of the solid-state storage controller 104. In one embodiment, the garbage collector bypass 316 is part of an autonomous garbage collector system that operates within the solid-state storage device 102. This allows the solid-state storage device 102 to manage data so that data is systematically spread throughout the solid-state storage media 110 to improve performance, data reliability and to avoid overuse and underuse of any one location or area of the solid-state storage media 110 and to lengthen the useful life of the solid-state storage media 110.

The garbage collector bypass 316 coordinates insertion of segments into the write data pipeline 106 with other segments being written by a host device 114 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write pipeline 108 to fill the remainder of the virtual page in order to improve the efficiency of storage within the solid-state storage media 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one virtual page in the solid-state storage media 110. This allows a write operation to send an entire page of data to the solid-state storage media 110 without interruption. By sizing the write buffer 320 of the write data pipeline 106 and buffers within the read data pipeline 108 to be the same capacity or larger than a storage write buffer within the solid-state storage media 110, writing and reading data is more efficient since a single write command may be crafted to send a full virtual page of data to the solid-state storage media 110 instead of multiple commands.

While the write buffer 320 is being filled, the solid-state storage media 110 may be used for other read operations. This is advantageous because other solid-state devices with a smaller write buffer or no write buffer may tie up the solid-state storage when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again this is inefficient because multiple write/program cycles are required to fill a page.

For depicted embodiment with a write buffer 320 sized larger than a virtual page, a single write command, which includes numerous subcommands, can then be followed by a single program command to transfer the page of data from the storage write buffer in each solid-state storage element 216, 218, 220 to the designated page within each solid-state storage element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO") register with a capacity of more than a virtual page of data segments. One of skill in the art will recognize other write buffer 320 configurations that allow a virtual page of data to be stored prior to writing the data to the solid-state storage media 110.

In another embodiment, the write buffer 320 is sized smaller than a virtual page so that less than a page of information could be written to a storage write buffer in the solid-state storage media 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the solid-state storage media 110 to fill the pages of a virtual page prior to programming the data. In this way a data stall in the write data pipeline 106 would not stall reading from the solid-state storage device 102.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the solid-state storage controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC correction module 322 that determines if a data error exists in ECC blocks a requested packet received from the solid-state storage media 110 by using ECC stored with each ECC block of the requested packet. The ECC correction module 322 then corrects any errors in the requested packet if any error exists and the errors are correctable using the ECC. For example, if the ECC can detect an error in six bits but can only correct three bit errors, the ECC correction module 322 corrects ECC blocks of the requested packet with up to three bits in error. The ECC correction module 322 corrects the bits in error by changing the bits in error to the correct one or zero state so that the requested data packet is identical to when it was written to the solid-state storage media 110 and the ECC was generated for the packet.

If the ECC correction module 322 determines that the requested packets contains more bits in error than the ECC can correct, the ECC correction module 322 cannot correct the errors in the corrupted ECC blocks of the requested packet and sends an interrupt. In one embodiment, the ECC correction module 322 sends an interrupt with a message indicating that the requested packet is in error. The message may include information that the ECC correction module 322 cannot correct the errors or the inability of the ECC correction module 322 to correct the errors may be implied. In another embodiment, the ECC correction module 322 sends the corrupted ECC blocks of the requested packet with the interrupt and/or the message.

In one embodiment, a corrupted ECC block or portion of a corrupted ECC block of the requested packet that cannot be corrected by the ECC correction module 322 is read by the master controller 224, corrected, and returned to the ECC correction module 322 for further processing by the read data pipeline 108. In one embodiment, a corrupted ECC block or portion of a corrupted ECC block of the requested packet is sent to the device requesting the data. The requesting device 155 may correct the ECC block or replace the data using another copy, such as a backup or mirror copy, and then may use the replacement data of the requested data packet or return it to the read data pipeline 108. The requesting device 155 may use header information in the requested packet in error to identify data required to replace the corrupted requested packet or to replace the data structure to which the packet belongs. In another embodiment, the solid-state storage controller 104 stores data using some type of RAID and is able to recover the corrupted data. In another embodiment, the ECC correction module 322 sends an interrupt and/or message and the receiving device fails the read operation associated with the requested data packet. One of skill in the art will recognize other options and actions to be taken as a result of the ECC correction module 322 determining that one or more ECC blocks of the requested packet are corrupted and that the ECC correction module 322 cannot correct the errors.

The read data pipeline 108 includes a depacketizer 324 that receives ECC blocks of the requested packet from the ECC correction module 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required for index reconstruction. Further examples include the transfer of packets of various types destined for use within the solid-state storage device 102. In another embodiment, the depacketizer 324 operation may be packet type dependent.

The read data pipeline 108 includes an alignment module 326 that receives data from the depacketizer 324 and removes unwanted data. In one embodiment, a read command sent to the solid-state storage media 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of a data structure in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device 155 and joined to form a response. For example, data from a portion of a first data packet may be combined with data from a portion of a second data packet. If a data segment is larger than a data requested by the requesting device 155, the alignment module 326 may discard the unwanted data.

In one embodiment, the read data pipeline 108 includes a read synchronization buffer 328 that buffers one or more requested packets read from the solid-state storage media 110 prior to processing by the read data pipeline 108. The read synchronization buffer 328 is at the boundary between the solid-state storage clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device 155. The output buffer 330 accounts for differences between when data segments are received from stages of the read data pipeline 108 and when the data segments are transmitted to other parts of the solid-state storage controller 104 or to the requesting device 155. The output buffer 330 also allows the data bus 204 to receive data from the read data pipeline 108 at rates greater than can be sustained by the read data pipeline 108 in order to improve efficiency of operation of the data bus 204.

In one embodiment, the read data pipeline 108 includes a media decryption module 332 that receives one or more encrypted requested packets from the ECC correction module 322 and decrypts the one or more requested packets using the encryption key unique to the solid-state storage device 102 prior to sending the one or more requested packets to the depacketizer 324. Typically the encryption key used to decrypt data by the media decryption module 332 is identical to the encryption key used by the media encryption module 318. In another embodiment, the solid-state storage media 110 may have two or more partitions and the solid-state storage controller 104 behaves as though it was two or more solid-state storage controllers 104 each operating on a single partition within the solid-state storage media 110. In this embodiment, a unique media encryption key may be used with each partition.

In another embodiment, the read data pipeline 108 includes a decryption module 334 that decrypts a data segment formatted by the depacketizer 324 prior to sending the data segment to the output buffer 330. The data segment may be decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. When the packet was stored with a non-secret cryptographic nonce, the nonce is used in conjunction with an encryption key to decrypt the data packet. The encryption key may be received from a host device 114, a computer, key manager, or other device that manages the encryption key to be used by the solid-state storage controller 104.

In another embodiment, the read data pipeline 108 includes a decompression module 336 that decompresses a data segment formatted by the depacketizer 324. In one embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per data structure type or data structure class basis. A first packet of a first object may be able to override a default decompression routine and a second packet of a second data structure of the same data structure class and data structure type may use the default decompression routine and a third packet of a third data structure of the same data structure class and data structure type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The solid-state storage controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC generator 304. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

Figure 4:
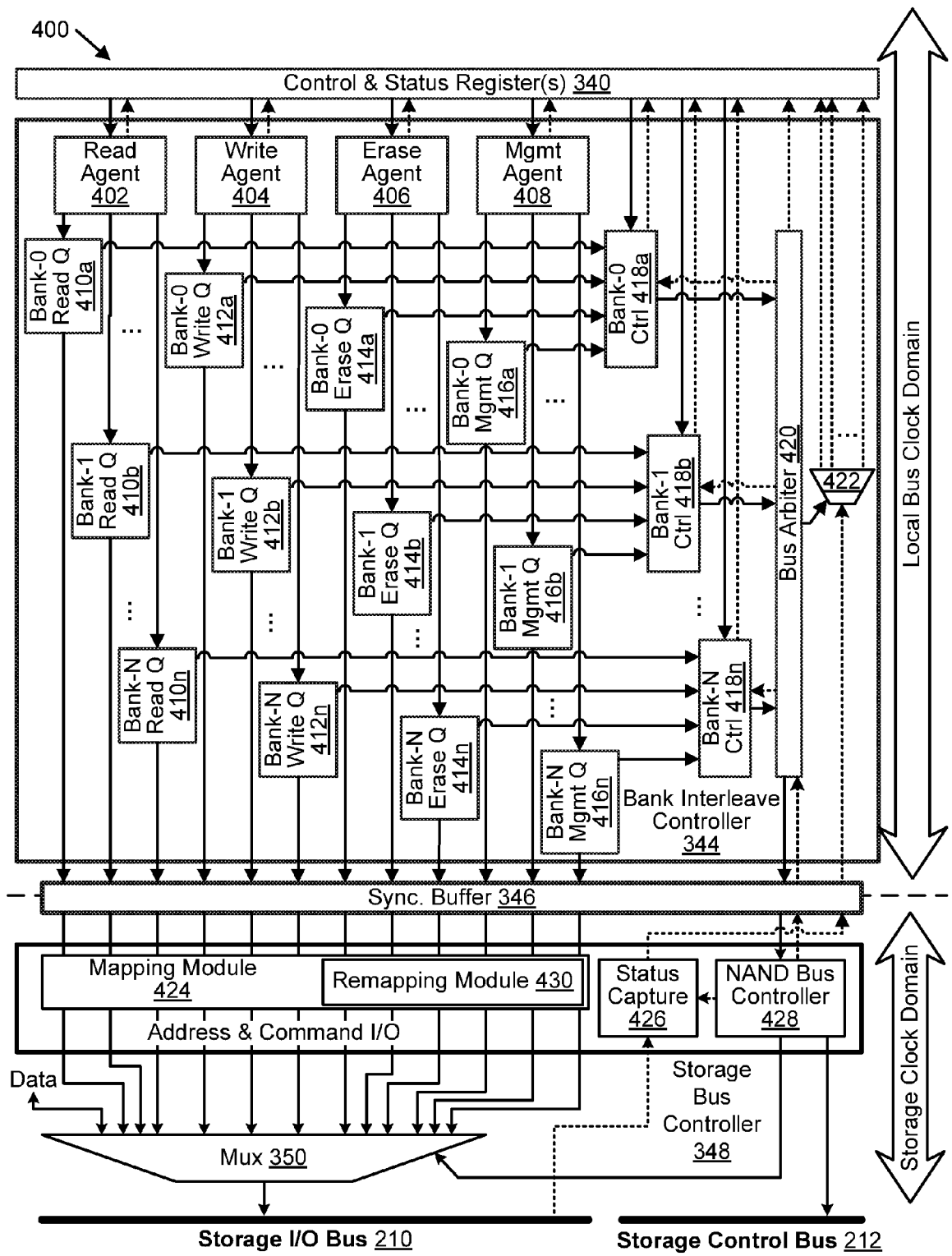
FIG. 4 is a schematic block diagram illustrating one embodiment of a bank interleave controller in the solid-state storage controller in accordance with the present invention.

The solid-state storage controller 104 and or the solid-state storage device 102 may also include a bank interleave controller 344, a synchronization buffer 346, a storage bus controller 348, and a multiplexer ("MUX") 350, which are described in relation to FIG. 4.

Bank Interleave

FIG. 4 is a schematic block diagram illustrating one embodiment 400 of a bank interleave controller 344 in the solid-state storage controller 104 in accordance with the present invention. The bank interleave controller 344 is connected to the control and status registers 340 and to the storage I/O bus 210 and storage control bus 212 through the MUX 350, storage bus controller 348, and synchronization buffer 346, which are described below. The bank interleave controller 344 includes a read agent 402, a write agent 404, an erase agent 406, a management agent 408, read queues 410a-n, write queues 412a-n, erase queues 414a-n, and management queues 416a-n for the banks 214 in the solid-state storage media 110, bank controllers 418a-n, a bus arbiter 420, and a status MUX 422, which are described below. The storage bus controller 348 includes a mapping module 424 with a remapping module 430, a status capture module 426, and a NAND bus controller 428, which are described below.

The bank interleave controller 344 directs one or more commands to two or more queues in the bank interleave controller 104 and coordinates among the banks 214 of the solid-state storage media 110 execution of the commands stored in the queues, such that a command of a first type executes on one bank 214a while a command of a second type executes on a second bank 214b. The one or more commands are separated by command type into the queues. Each bank 214 of the solid-state storage media 110 has a corresponding set of queues within the bank interleave controller 344 and each set of queues includes a queue for each command type.

The bank interleave controller 344 coordinates among the banks 214 of the solid-state storage media 110 execution of the commands stored in the queues. For example, a command of a first type executes on one bank 214a while a command of a second type executes on a second bank 214b. Typically the command types and queue types include read and write commands and queues 410, 412, but may also include other commands and queues that are storage media specific. For example, in the embodiment depicted in FIG. 4, erase and management queues 414, 416 are included and would be appropriate for flash memory, NRAM, MRAM, DRAM, PRAM, SONOS, RRAM, PMC, CBRAM, racetrack memory, memristor memory, nanocrystal wire-based memory, silicon-oxide based sub-10 nanometer process memory, graphene memory, etc.

For other types of solid-state storage media 110, other types of commands and corresponding queues may be included without straying from the scope of the invention. The flexible nature of an FPGA solid-state storage controller 104 allows flexibility in storage media. If flash memory were changed to another solid-state storage type, the bank interleave controller 344, storage bus controller 348, and MUX 350 could be altered to accommodate the media type without significantly affecting the data pipelines 106, 108 and other solid-state storage controller 104 functions.

In the embodiment depicted in FIG. 4, the bank interleave controller 344 includes, for each bank 214, a read queue 410 for reading data from the solid-state storage media 110, a write queue 412 for write commands to the solid-state storage media 110, an erase queue 414 for erasing an erase block in the solid-state storage, an a management queue 416 for management commands. The bank interleave controller 344 also includes corresponding read, write, erase, and management agents 402, 404, 406, 408. In another embodiment, the control and status registers 340 and control queues 342 or similar components queue commands for data sent to the banks 214 of the solid-state storage media 110 without a bank interleave controller 344.

The agents 402, 404, 406, 408, in one embodiment, direct commands of the appropriate type destined for a particular bank 214a to the correct queue for the bank 214a. For example, the read agent 402 may receive a read command for bank-1 214b and directs the read command to the bank-1 read queue 410b. The write agent 404 may receive a write command to write data to a location in bank-0 214a of the solid-state storage media 110 and will then send the write command to the bank-0 write queue 412a. Similarly, the erase agent 406 may receive an erase command to erase an erase block in bank-1 214b and will then pass the erase command to the bank-1 erase queue 414b. The management agent 408 typically receives management commands, status requests, and the like, such as a reset command or a request to read a configuration register of a bank 214, such as bank-0 214a. The management agent 408 sends the management command to the bank-0 management queue 416a.

The agents 402, 404, 406, 408 typically also monitor status of the queues 410, 412, 414, 416 and send status, interrupt, or other messages when the queues 410, 412, 414, 416 are full, nearly full, non-functional, etc. In one embodiment, the agents 402, 404, 406, 408 receive commands and generate corresponding sub-commands. In one embodiment, the agents 402, 404, 406, 408 receive commands through the control & status registers 340 and generate corresponding sub-commands which are forwarded to the queues 410, 412, 414, 416. One of skill in the art will recognize other functions of the agents 402, 404, 406, 408.

The queues 410, 412, 414, 416 typically receive commands and store the commands until required to be sent to the solid-state storage banks 214. In a typical embodiment, the queues 410, 412, 414, 416 are first-in, first-out ("FIFO") registers or a similar component that operates as a FIFO. In another embodiment, the queues 410, 412, 414, 416 store commands in an order that matches data, order of importance, or other criteria.

The bank controllers 418 typically receive commands from the queues 410, 412, 414, 416 and generate appropriate sub-commands. For example, the bank-0 write queue 412a may receive a command to write a page of data packets to bank-0 214a. The bank-0 controller 418a may receive the write command at an appropriate time and may generate one or more write subcommands for each data packet stored in the write buffer 320 to be written to the page in bank-0 214a. For example, bank-0 controller 418a may generate commands to validate the status of bank 0 214a and the solid-state storage array 216, select the appropriate location for writing one or more data packets, clear the input buffers within the solid-state storage memory array 216, transfer the one or more data packets to the input buffers, program the input buffers into the selected location, verify that the data was correctly programmed, and if program failures occur do one or more of interrupting the master controller 224, retrying the write to the same physical location, and retrying the write to a different physical location. Additionally, in conjunction with example write command, the storage bus controller 348 will cause the one or more commands to multiplied to each of the each of the storage I/O buses 210a-n with the logical address of the command mapped to a first physical addresses for storage I/O bus 210a, and mapped to a second physical address for storage I/O bus 210b, and so forth as further described below.

Typically, bus arbiter 420 selects from among the bank controllers 418 and pulls subcommands from output queues within the bank controllers 418 and forwards these to the Storage Bus Controller 348 in a sequence that optimizes the performance of the banks 214. In another embodiment, the bus arbiter 420 may respond to a high level interrupt and modify the normal selection criteria. In another embodiment, the master controller 224 can control the bus arbiter 420 through the control and status registers 340. One of skill in the art will recognize other means by which the bus arbiter 420 may control and interleave the sequence of commands from the bank controllers 418 to the solid-state storage media 110.

The bus arbiter 420 typically coordinates selection of appropriate commands, and corresponding data when required for the command type, from the bank controllers 418 and sends the commands and data to the storage bus controller 348. The bus arbiter 420 typically also sends commands to the storage control bus 212 to select the appropriate bank 214. For the case of flash memory or other solid-state storage media 110 with an asynchronous, bi-directional serial storage I/O bus 210, only one command (control information) or set of data can be transmitted at a time. For example, when write commands or data are being transmitted to the solid-state storage media 110 on the storage I/O bus 210, read commands, data being read, erase commands, management commands, or other status commands cannot be transmitted on the storage I/O bus 210. For example, when data is being read from the storage I/O bus 210, data cannot be written to the solid-state storage media 110.

For example, during a write operation on bank-0 the bus arbiter 420 selects the bank-0 controller 418a which may have a write command or a series of write sub-commands on the top of its queue which cause the storage bus controller 348 to execute the following sequence. The bus arbiter 420 forwards the write command to the storage bus controller 348, which sets up a write command by selecting bank-0 214a through the storage control bus 212, sending a command to clear the input buffers of the solid-state storage elements 110 associated with the bank-0 214a, and sending a command to validate the status of the solid-state storage elements 216, 218, 220 associated with the bank-0 214a.

The storage bus controller 348 then transmits a write sub-command on the storage I/O bus 210, which contains the physical addresses including the address of the logical erase block for each individual physical erase solid-stage storage element 216a-m as mapped from the logical erase block address. The storage bus controller 348 then muxes the write buffer 320 through the write sync buffer 308 to the storage I/O bus 210 through the MUX 350 and streams write data to the appropriate page. When the page is full, then storage bus controller 348 causes the solid-state storage elements 216a-m associated with the bank-0 214a to program the input buffer to the memory cells within the solid-state storage elements 216a-m. Finally, the storage bus controller 348 validates the status to ensure that page was correctly programmed.

A read operation is similar to the write example above. During a read operation, typically the bus arbiter 420, or other component of the bank interleave controller 344, receives data and corresponding status information and sends the data to the read data pipeline 108 while sending the status information on to the control and status registers 340. Typically, a read data command forwarded from bus arbiter 420 to the storage bus controller 348 will cause the MUX 350 to gate the read data on storage I/O bus 210 to the read data pipeline 108 and send status information to the appropriate control and status registers 340 through the status MUX 422.

The bus arbiter 420 coordinates the various command types and data access modes so that only an appropriate command type or corresponding data is on the bus at any given time. If the bus arbiter 420 has selected a write command, and write subcommands and corresponding data are being written to the solid-state storage media 110, the bus arbiter 420 will not allow other command types on the storage I/O bus 210. Beneficially, the bus arbiter 420 uses timing information, such as predicted command execution times, along with status information received concerning bank 214 status to coordinate execution of the various commands on the bus with the goal of minimizing or eliminating idle time of the busses.

The master controller 224 through the bus arbiter 420 typically uses expected completion times of the commands stored in the queues 410, 412, 414, 416, along with status information, so that when the subcommands associated with a command are executing on one bank 214a, other subcommands of other commands are executing on other banks 214b-n. When one command is fully executed on a bank 214a, the bus arbiter 420 directs another command to the bank 214a. The bus arbiter 420 may also coordinate commands stored in the queues 410, 412, 414, 416 with other commands that are not stored in the queues 410, 412, 414, 416.

For example, an erase command may be sent out to erase a group of erase blocks within the solid-state storage media 110. An erase command may take 10 to 1000 times more time to execute than a write or a read command or 10 to 100 times more time to execute than a program command. For N banks 214, the bank interleave controller 344 may split the erase command into N commands, each to erase a virtual erase block of a bank 214a. While bank-0 214a is executing an erase command, the bus arbiter 420 may select other commands for execution on the other banks 214b-n. The bus arbiter 420 may also work with other components, such as the storage bus controller 348, the master controller 224, etc., to coordinate command execution among the buses. Coordinating execution of commands using the bus arbiter 420, bank controllers 418, queues 410, 412, 414, 416, and agents 402, 404, 406, 408 of the bank interleave controller 344 can dramatically increase performance over other solid-state storage systems without a bank interleave function.

In one embodiment, the solid-state controller 104 includes one bank interleave controller 344 that serves all of the storage elements 216, 218, 220 of the solid-state storage media 110. In another embodiment, the solid-state controller 104 includes a bank interleave controller 344 for each column of storage elements 216a-m, 218a-m, 220a-m. For example, one bank interleave controller 344 serves one column of storage elements SSS 0.0-SSS M.0 216a, 216b, . . . 216m, a second bank interleave controller 344 serves a second column of storage elements SSS 0.1-SSS M.1 218a, 218b, . . . 218m etc.
Storage-Specific Components The solid-state storage controller 104 includes a synchronization buffer 346 that buffers commands and status messages sent and received from the solid-state storage media 110. The synchronization buffer 346 is located at the boundary between the solid-state storage clock domain and the local bus clock domain and provides buffering to account for the clock domain differences. The synchronization buffer 346, write synchronization buffer 308, and read synchronization buffer 328 may be independent or may act together to buffer data, commands, status messages, etc. In one embodiment, the synchronization buffer 346 is located where there are the fewest number of signals crossing the clock domains. One skilled in the art will recognize that synchronization between clock domains may be arbitrarily moved to other locations within the solid-state storage device 102 in order to optimize some aspect of design implementation.

The solid-state storage controller 104 includes a storage bus controller 348 that interprets and translates commands for data sent to and read from the solid-state storage media 110 and status messages received from the solid-state storage media 110 based on the type of solid-state storage media 110. For example, the storage bus controller 348 may have different timing requirements for different types of storage, storage with different performance characteristics, storage from different manufacturers, etc. The storage bus controller 348 also sends control commands to the storage control bus 212.

In one embodiment, the solid-state storage controller 104 includes a MUX 350 that comprises an array of multiplexers 350a-n where each multiplexer is dedicated to a row in the solid-state storage array 110. For example, multiplexer 350a is associated with solid-state storage elements 216a, 218a, 220a. MUX 350 routes the data from the write data pipeline 106 and commands from the storage bus controller 348 to the solid-state storage media 110 via the storage I/O bus 210 and routes data and status messages from the solid-state storage media 110 via the storage I/O bus 210 to the read data pipeline 108 and the control and status registers 340 through the storage bus controller 348, synchronization buffer 346, and bank interleave controller 344.

In one embodiment, the solid-state storage controller 104 includes a MUX 350 for each column of solid-state storage elements (e.g. SSS 0.0 216a, SSS 1.0 218a, SSS N.0 220a). A MUX 350 combines data from the write data pipeline 106 and commands sent to the solid-state storage 110 via the storage I/O bus 210 and separates data to be processed by the read data pipeline 108 from commands. Packets stored in the write buffer 320 are directed on busses out of the write buffer 320 through a write synchronization buffer 308 for each column of solid-state storage elements (SSS 0.x to SSS N.x 216, 218, 220) to the MUX 350 for each column of solid-state storage elements (SSS 0.x to SSS N.x 216, 218, 220). The commands and read data are received by the MUXes 350 from the storage I/O bus 210. The MUXes 350 also direct status messages to the storage bus controller 348.

The storage bus controller 348 includes a mapping module 424. The mapping module 424 maps a logical address of an erase block to one or more physical addresses of an erase block. For example, a solid-state storage 110 with an array of twenty storage elements (e.g. SSS 0.0 to SSS 0.M 216) per bank 214a may have a logical address for a particular erase block mapped to twenty physical addresses of the erase block, one physical address per storage element. Because the storage elements are accessed in parallel, erase blocks at the same position in each storage element in a column of storage elements 216a, 218a, 220a will share a physical address. To select one erase block (e.g. in storage element SSS 0.0 216a) instead of all erase blocks in the column (e.g. in storage elements SSS 0.0, 1.0, . . . N.0 216a, 218a, 220a), one bank (in this case Bank 0 214a) is selected.

This logical-to-physical mapping for erase blocks is beneficial because if one erase block becomes damaged or inaccessible, the mapping can be changed to map to another erase block. This mitigates the loss of losing an entire virtual erase block when one element's erase block is faulty. The remapping module 430 changes a mapping of a logical address of an erase block to one or more physical addresses of a virtual erase block (spread over the array of storage elements). For example, virtual erase block 1 may be mapped to erase block 1 of storage element SSS 0.0 216a, to erase block 1 of storage element SSS 0.1 216b, . . . , and to storage element 0.M 216m, virtual erase block 2 may be mapped to erase block 2 of storage element SSS 1.0 218a, to erase block 2 of storage element SSS 1.1 218b, . . . , and to storage element 1.M 218m, etc. Alternatively, virtual erase block 1 may be mapped to one erase block from each storage element in an array such that virtual erase block 1 includes erase block 1 of storage element SSS 0.0 216a to erase block 1 of storage element SSS 0.1 216b to storage element 0.M 216m, and erase block 1 of storage element SSS 1.0 218a to erase block 1 of storage element SSS 1.1 218b, . . . , and to storage element 1.M 218m, for each storage element in the array up to erase block 1 of storage element N.M 220m.

If erase block 1 of a storage element SSS0.0 216a is damaged, experiencing errors due to wear, etc., or cannot be used for some reason, the remapping module 430 could change the logical-to-physical mapping for the logical address that pointed to erase block 1 of virtual erase block 1. If a spare erase block (call it erase block 221) of storage element SSS 0.0 216a is available and currently not mapped, the remapping module 430 could change the mapping of virtual erase block 1 to point to erase block 221 of storage element SSS 0.0

216*a*, while continuing to point to erase block 1 of storage element SSS 0.1 216*b*, erase block 1 of storage element SSS 0.2 (not shown) . . . , and to storage element 0.M 216*m*. The mapping module 424 or remapping module 430 could map erase blocks in a prescribed order (virtual erase block 1 to erase block 1 of the storage elements, virtual erase block 2 to erase block 2 of the storage elements, etc.) or may map erase blocks of the storage elements 216, 218, 220 in another order based on some other criteria.

In one embodiment, the erase blocks could be grouped by access time. Grouping by access time, meaning time to execute a command, such as programming (writing) data into pages of specific erase blocks, can level command completion so that a command executed across the erase blocks of a virtual erase block is not limited by the slowest erase block. In other embodiments, the erase blocks may be grouped by wear level, health, etc. One of skill in the art will recognize other factors to consider when mapping or remapping erase blocks.

In one embodiment, the storage bus controller 348 includes a status capture module 426 that receives status messages from the solid-state storage 110 and sends the status messages to the status MUX 422. In another embodiment, when the solid-state storage 110 is flash memory, the storage bus controller 348 includes a NAND bus controller 428. The NAND bus controller 428 directs commands from the read and write data pipelines 106, 108 to the correct location in the solid-state storage 110, coordinates timing of command execution based on characteristics of the flash memory, etc. If the solid-state storage 110 is another solid-state storage type, the NAND bus controller 428 would be replaced by a bus controller specific to the storage type. One of skill in the art will recognize other functions of a NAND bus controller 428.

Data Transformations/Predicate Offloading

Advantageously, certain embodiments of the solid-state storage device 102 are configured to apply a data transformation to data passing through the pipelines 106, 108.

Figure 5:
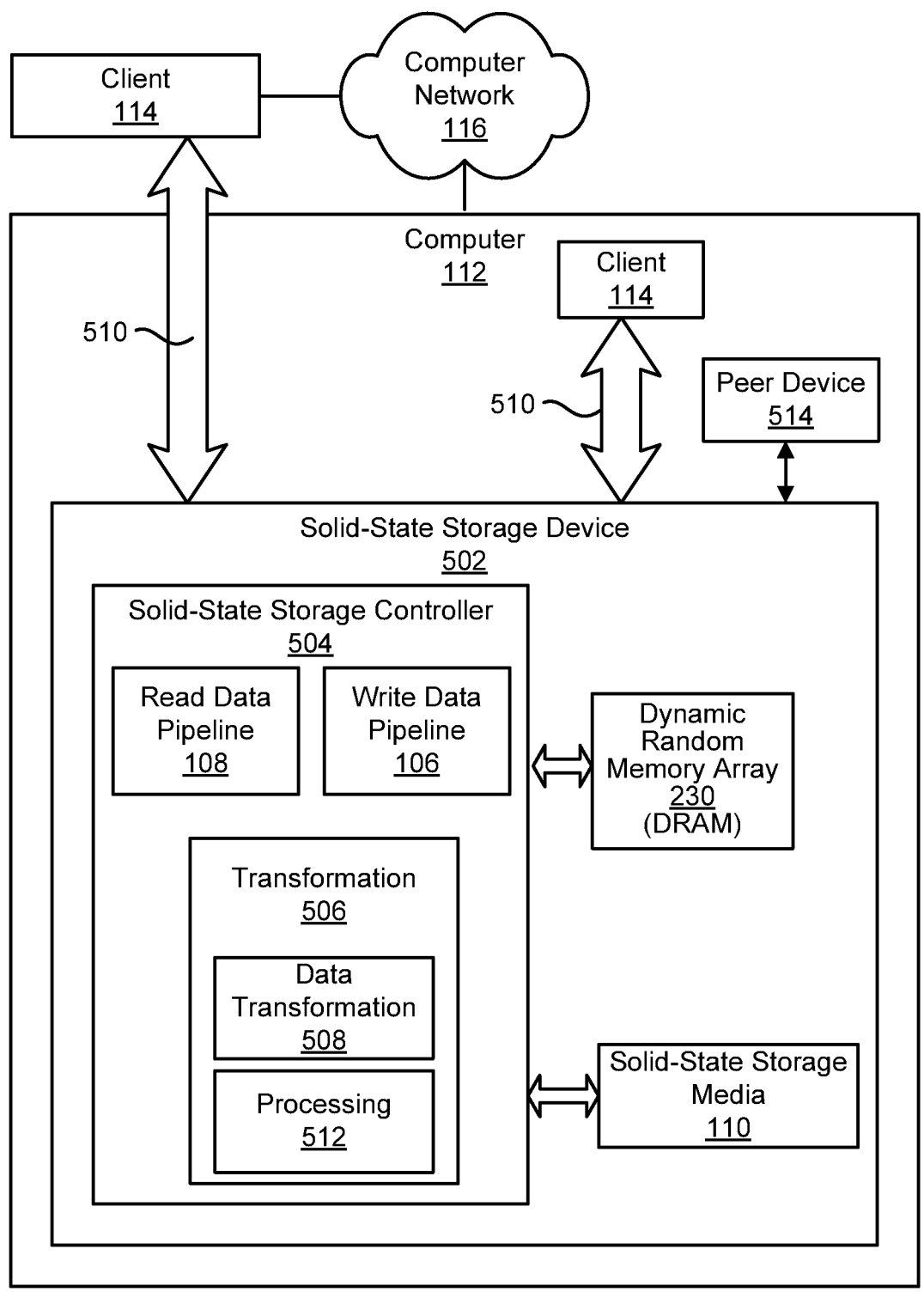
FIG. 5 is a schematic block diagram illustrating one embodiment of a host device such as a computer coupled to a solid-state storage device controller for transforming data in accordance with the present invention.

FIG. 5 illustrates one embodiment of a solid-state storage device 502. FIG. 5 refers to elements of FIGS. 1 and 2, like numbers referring to like elements. The illustrated embodiment includes a solid-state storage device 502 in communication with a storage client 114. The storage client 114 is in communication with a solid-state storage device 502, which, in certain embodiments, is substantially similar to the solid-state storage device 102 of FIGS. 1 and 2, described above. In the depicted embodiment, the solid-state storage device 502 is also in communication with a peer device 514. The solid-state storage device 502, in the illustrated embodiment, includes a solid-state storage controller module 504, a dynamic random memory array 230, and solid-state storage media 110.

The solid-state storage controller module 504 includes a read data pipeline 108, a write data pipeline 106 and a transformation module 506. In the illustrated embodiment, the transformation module 506 is separate from the read data pipeline 108 and write data pipeline 106. In another embodiment, one or more features, functions, aspects or logic of the transformation module 506 is integrated into one or both of the read data pipeline 108 and write data pipeline 106. For example, different aspects of the transformation module 506 may be implemented using the write program module 310 and/or read program module 338 described above in relation to FIG. 3.

The transformation module 506 serves to apply a condition, predicate, or data transformation to data passing between the client 114 and the solid-state storage media 110 by way of the write data pipeline 106 or read data pipeline 108. The transformation module 506 receives or otherwise identifies a transformation indicator indicating whether or not the transformation module 506 is to apply a data transformation to a set of data. A transformation indicator may be a dynamic indicator, such as a client request, or a static indicator, such as a predefined setting. A transformation indicator, such as a client request or predefined setting, may include a location identifier, an identifier of a data transformation, and an optional indicator of the return result requested. A client request is a command, setting, trigger, or other transformation indicator from a client 114, requesting that the transformation module 506 apply a data transformation 508 to a set of data.

One embodiment of a client request is a storage request from a client 114 that has a predefined transformation characteristic. For example, as described below, a storage request for a set of data that is smaller than a data block of the solid-state storage device 502 may trigger the transformation module 506 to apply a data transformation 508. In other embodiments, a storage request may include a flag, a marker, or other indicator triggering the transformation module 506 to apply a data transformation 508.

Another embodiment of a client request is a transformation request that a client 114 sends to the solid-state storage device 502 separate from a storage request. A client 114 may send client requests or other transformation information over an interface 510, as described below. In one embodiment, a client 114 sends a synchronous transformation request for each storage request, sending the synchronous transformation requests in the same data pipeline or interface 510 as the storage requests. As used herein, a synchronous transformation requests is a request for which the application of the transformation may be timed to be in sync with a flow of data through a data pipeline. In another embodiment, a client 114 may send an asynchronous transformation request for each storage request in a separate command pipeline or interface 510 from the storage requests. In a further embodiment, instead of sending a transformation request for each storage request, a client 114 may send a transformation request only for storage requests for data sets to which the transformation module 506 is to apply a data transformation 506. Alternatively, a client 114 may send a transformation request only for storage requests for data sets to which the transformation module 506 is not to apply a data transformation 506.

In certain embodiments, a transformation request may apply to multiple data sets or storage requests. For example, a client 114 may send a transformation request for a plurality of storage requests, such as storage requests of a certain type, a specified number of storage requests, or the like. Because the transformation request is persistent, the transformation module 506 applies a data transformation 508 for each storage request of the plurality of storage requests, without requiring a separate transformation request for each storage request. In another embodiment, a transformation request may be associated with a set of LBAs, and the transformation module 506 may apply a data transformation 508 to any set of data associated with the set of LBAs. In a further embodiment, a transformation request may be a global request for the solid-state storage device 502, and the transformation module 506 may apply a data transformation 508 to any data set written to or read from the entire solid-state storage device 502. A global transformation request, in certain embodiments, may not apply to system data, management data, or metadata of the solid-state storage device 502, but to user data/workload data. Other transformation requests may toggle, change, or otherwise modify previous transformation requests.

As described above, in certain embodiments, a transformation indicator, such as a client request or predefined setting, may comprise a location identifier. The location identifier indicates where in the set of data received from the client 114, or set of data retrieved from the solid-state storage media 110, the transformation is to be applied to. In certain embodiments, the location identifier also identifies the quantity of data the transformation will be applied to. This quantity may be a fixed size (e.g. data stored in fixed size blocks/sectors/packets) or a variable size (e.g. objects in an object store). The location identifier may comprise a physical address of a single physical page or logical page in an array of non-volatile solid-state storage elements 216, 218, 220. The physical address may comprise an erase block address plus an offset. The offset may identify a particular physical page. The location identifier may comprise a logical block address of a block/sector/packet stored on the solid-state storage media 110.

The location identifier indicates where in a stream of data (read pipeline or write pipeline) the transformation module 506 is to begin applying the transformation. Where the size of the data blocks is fixed, or the location of subsequent data sets for the transformation module 506 is deterministic, the transformation module 506 may begin applying the data transformation for a predetermined number of data sets. In certain embodiments, the location identifier is sent by the client 114 along with a client request or storage request. In other embodiments, the location identifier is integrated with the data flowing through the pipelines 106, 108. For example, in one embodiment predefined markers, flags, or other indicators are sent with data to be stored on the media 110 and/or stored with the data on the media 110. In another embodiment, data fields in a header or other metadata of a data set stored, or to be stored, on the media 110 serves as the location identifier.

For example, in one embodiment, a database management system (DBMS) client 114 may add a marker to the beginning or end of each row of data stored in a tablespace. These table spaces may be stored within one or more extents, which may in turn be stored within one or more files, which may be divided into one or more blocks that are then stored on the solid-state storage media 110. Consequently, the DBMS client 114 may submit a storage request for all data in a table. The storage request may include a data transformation 508 that keys off of the marker for a start of a row of data plus an offset. The marker that is stored with the data on the media 110 and an optional offset into the row may constitute the location identifier.

In certain embodiments, the solid-state storage device 502 services a plurality of storage requests simultaneously from a plurality of clients 114. Certain storage requests may include a request for the transformation module 506 to apply a data transformation 508 while others may not. Consequently, the solid-state storage controller module 504, in certain embodiments, is configured to coordinate the flow of data through the write data pipeline 106 and onto the media 110 and to coordinate the flow of data off of the media 110 and through the read data pipeline 106 with the storage requests such that the transformation module 506 applies the data transformation 508 to the correct set of data as that data passes through the corresponding pipeline 106, 108. This coordination process is referred to herein as synchronization. One embodiment for synchronizing application of a data transformation 508 with the correct set of data is illustrated and described in relation to FIG. 6. In certain embodiments, the transformation module 506 monitors the flow of data within the write data pipeline 106 and/or the read data pipeline 108 to identify a set of data on which to apply a transformation. The transformation used by the transformation module 506 may comprise a predicate, a condition, and/or a data transformation operation to be applied to a set of data. The transformation is the data transformation 508 described in more detail below.

The indicator of the return result requested identifies what type of result the transformation module 506 should return to the client 114. If the storage request is a read request combined with application of a data transformation 508, the return result may comprise a Boolean True or False to indicate if there was data on the media 110 that satisfied the predicate. Alternatively, the return result may comprise a count of sets of data on the media 110 that satisfied the predicate. Alternatively, the return result may comprise a count or a Boolean indicator as well as the sets of data on the media 110 that satisfied the predicate. Alternatively, or in addition, the return result may comprise the sets of data on the media 110 that satisfied the predicate as well as a count of sets of data that failed to satisfy the predicate. Returning the count of sets of data that failed to satisfy the predicate may provide an indication to the client 114 of the magnitude of filtering the transformation module 506 has provided.

The transformation module 506 applies one or more data transformations 508 to one or more data blocks or parts of data blocks passing through the solid-state storage device 502, or to particular data blocks passing through the solid-state storage device 502. The transformation module 506 may apply a data transformation 508 in response to an indicator from a client 114. Advantageously, the data transformation 508 applied to one or more data blocks passing through the solid-state storage device 502 reduces the quantity of data passing into, or out of, the solid-state storage device 502. In this manner, the data transformations 508 are performed as close to the solid-state storage media 110 as possible, while still maintaining high throughput, bandwidth, and data integrity.

In one embodiment, the solid-state storage controller module 504 is a field-programmable gate array ("FPGA") and controller functions are programmed into the FPGA. In a particular embodiment, the FPGA is a Xilinx® FPGA. In certain embodiments, the FPGA is a Look Up Tables ("LUTs") based FPGA. In another embodiment, the solid-state storage controller module 504 comprises components specifically designed as a solid-state storage controller module 504, such as an application-specific integrated circuit ("ASIC") or custom logic solution. In another embodiment, at least one solid-state storage controller module 504 is made up of a combination FPGA, ASIC, processors, and custom logic components either distinct or integrated with each other in different configurations. In another embodiment, the solid-state storage controller module 504 comprises a hybrid device comprising FPGA components integrated with general purpose processors (CPUs or GPUs, e.g. Performance Optimization with Enhanced RISC—Performance Computing (PowerPC or PPC) processor) in a single chip or package. As used herein, the term logic hardware includes both hardware devices, such as FPGAs, ASICs, and processors, and programmable elements for hardware devices, such as firmware for an FPGA, microcode for a processor, and the like.

Embodiments of the solid-state storage controller module 504 implemented using an FPGA and/or a hybrid device enable dynamic reconfiguration or reprogramming such that the solid-state storage controller module 504 can adapt to implement one or more data transformation 508 without changing the hardware used for the solid-state storage controller module 504. In one embodiment, the solid-state storage controller module 504 includes the processing logic to execute an arbitrary data transformation 508 using for example a general purpose processor or CPU. For example, a client 114 may supply the arbitrary data transformation 508 in the form of directly executable code (i.e. assembly). In another embodiment, the solid-state storage controller module 504 is programmable such that the solid-state storage controller module 504 can be programmed or reprogrammed to implement an arbitrary data transformation 508 using for example gates of an FPGA.

For example, at the time a solid-state storage device 502 is installed or formatted, the setup or configuration process can include programming or configuring the solid-state storage controller module 504 to support one or more data transformations 508. In one embodiment, the transformation module 506 is configured to apply a single data transformation 508. In another embodiment, the transformation module 506 is configured to apply two or more data transformation 508 selected from a set of data transformations 508.

In addition, or alternatively, the solid-state storage controller module 504 may be programmed during run-time operation to support or apply one or more data transformations 508. Definitions for these data transformations 508 may be supplied in the form of Verilog or netlist instructions that cause an FPGA to configure certain gates to support a logic operation represented by the Verilog or netlist instructions. Programming or re-programming the solid-state storage controller module 504 to support one or more different data transformations 508 may be done at different levels of execution granularity. For example, in one embodiment, a data transformation 508 is programmed for a particular data storage request from a particular client 114. In another embodiment, a data transformation 508 is programmed for each data storage request from a particular client 114. In certain embodiments, the solid-state storage controller module 504 is programmed with a plurality of different data transformations 508 and a selection circuit. In such an embodiment, the transformation module 506 may apply a different data transformation 508 by activating the selection circuit to activate a particular data transformation 508 for a set of data identified by the location identifier. The transformation module 506 may activate a particular data transformation 508 by sending data in the pipeline 106, 108 through the selected data transformation circuit.

A data transformation 508 may comprise a predefined data transformation 508 or a data transformation 508 supplied by the client 114. Advantageously, the solid-state storage device 502 is dynamically programmable and/or configurable to execute a wide range of transformations 508 so long as the transformations 508 conform to a predefined language and grammar. Predefined data transformation 508 may be selected from a library of possible data transformations 508. The predefined data transformation 508 are in a format and syntax suitable for the transformation module 508 to apply the data transformation 508 without further processing.

In addition, or alternatively, the transformation module 506 may comprise a fully programmable Central Processing Unit (CPU). The CPU may comprise a soft-core implemented within an FPGA or a hard-core such as an Advanced RISC Machine (ARM) or PowerPC processor integrated with an FPGA. The client 114 may include with a storage request a transformation in the form of script code or other human readable code such as source code. The transformation module 506 may dynamically compile or interpret the source code or script code at run-time to generate a corresponding data transformation 508.

Data transformations 508 relating to different purposes may be applied. For example, in one embodiment a data transformation 508 facilitates managing data integrity information. One form of data integrity protection that the transformation module 506 applies, in one embodiment, is adding and/or removing T10 Data Integrity Field (DIF)/DIX metadata to blocks for managing data integrity. Adding of data for the purpose of data integrity protection may be advantageous where the solid-state storage device 502 serves in a tiered storage architecture in which the solid-state storage device 502 passes data down to lower tiers. Where the lower tiers do not offer a desired level of data integrity protection such as the DIF/DIX meta data, the solid-state storage device 502 can supply such missing functionality. For example, where the solid-state storage device 502 is used as a cache (described in U.S. patent application Ser. No. 12/877,971, filed Sep. 8, 2010 to David Flynn, et al, entitled "Apparatus, system, and method for caching data on a solid-state storage device", which is hereby incorporated by reference) in front of a backing store that does not support the T10 DIF form of data integrity protection.

T10 DIF metadata comes in different types. The T10 DIF metadata may be passed through the I/O stack to facilitate identifying if there is a data integrity error. For T10 DIF, the integrity metadata is 8 bytes—the 8 bytes are a tuple of (a 16 bit CRC, a 16 bit placation tag, and a 32 bit reference tag—often an incrementing counter). By applying a T10 DIF transformation the transformation module 506 accomplishes a goal of T10 DIF of computing this metadata as close in proximity to the original data as possible. The DIF/DIX data integrity computation adds an additional layer of data integrity protection (regardless of the underlying media). T10 DIF/DIX implements a Cyclic Redundancy Check (CRC) so, while errors are not correctable by T10 DIF metadata they are detectable.

In another embodiment, the data transformation 508 comprises a filter that reduces the size of the set of data stored to the solid-state storage media 110, or returned to the client 114 based on some predicate or condition that excludes data that fails to satisfy the predicate. Filtering of data between the solid-state storage device 502 and the computer 112 permits efficient use of the communication path (e.g. system bus 240, such as PCIe, described above in relation to FIG. 2). In certain embodiments, the architecture and protocol used for the communication path limits the bandwidth and throughput of data between the computer 112 and the solid-state storage device 502. As the solid-state storage device 502 applies a data transformation 508 that filters the data as the data passes through the pipelines 106, 108 and at the same speed as data normally flows through the pipelines, the solid-state storage device 502 accomplishes performance advantages.

A filter data transformation 508 is a form of a predicate that is to be applied to the data as the data flows into, or out of, the pipelines 106, 108. As used herein, a predicate is a condition or other function which when applied to a data set returns either a true or a false result. While applying predicates to data sets has been performed by software applications or device drivers at higher levels in the storage software stack, the solid-state storage device 502 performs data transformations 508 at the solid-state storage controller module 504 level. Performing operations at a lower level than traditionally performed in the storage software stack is referred to herein as predicate offloading. Datasets satisfying the predicate return a true result and datasets failing to satisfy the predicate return a false result. Where a dataset satisfies a predicate, the transformation module 506 may select certain data from the dataset to include in a returned result set. In one embodiment, the data transformation 508 is applied to a whole data block (e.g. sector). Alternatively, the data transformation 508 is applied to a subset of the requested set of data. In another embodiment, the data transformation 508 is a combination transformation applied to both a whole data set and a subset of the data set.

Another type of data transformation 508 allows a client 114 to write and/or read data in data sizes less than a full data block (or data sector) of the solid-state storage device 502, accessing a sub-block (sub-sector). For example, the solid-state storage device 502 may store data in blocks or sectors with a fixed size, such as 512 bytes, 4096 bytes, or the like. When the transformation module 506 detects a storage request for an amount of data that is smaller than the block size for the solid-state storage device 502, the transformation module 506 may apply a data transformation 508 allowing access to a sub-block of data. For a read request, the data transformation 508 may include discarding a portion of a data block to return only data of the requested sub-block to a requesting client 114.

For a write request, the data transformation 508 may include a read, modify, write operation, performed internally within the solid-state storage device 102, so that the full block does not travel over a system bus to the computer 112 or require further processing on the computer 112. When a write request includes a set of data that is smaller than a block size (i.e. a sub-block), the transformation module 506 reads a full data block that includes the set of data from the solid-state storage media 110 into memory such as DRAM 230 or the like. The transformation module 506 modifies a portion of the data block, in memory, with the set of data. The write request may include an offset and size to identify the set of data within the data block. In one embodiment, the offset for the set of data comprises an indirect indicator for the offset, such as a logical block address for the set of data or the like. In another embodiment, the offset for the set of data comprises a direct indicator of the offset, such as a number of bytes into the data block that the set of data (the set of data maybe of a fixed or variable size and may be included in, or referenced by, the write request) is to be written, or the like.

The transformation module 506 may modify the data block in internal memory by overwriting a portion of the data block with the data set from the write request, or by otherwise modifying the data block to reflect changes from the received data set. The transformation module 506 writes the modified data block back out to the solid-state storage device 502. In one embodiment, the transformation module 506 writes the modified data block to an append point of a sequential log-based writing structure of the solid-state storage device 502, not to the location from which the data block was read. By applying the data transformation 508 internally within the solid-state storage device 502, without sending a full data block to the computer 112, the client 114, or another host device, the transformation module 506 conserves bandwidth on system buses, reduces processing overhead for a host device, and provides convenient sub-block access to clients 114.

A return result for applying the data transformation 508 may comprise a data set (including one or more data storage blocks or sectors both contiguously addressed and non-contiguously addressed), a subset of a requested dataset, and/or a Boolean indicator resulting from applying the data transformation 508.

Embodiments of the present invention support a variety of different levels of granularity for applying the data transformation 508. In one embodiment, the data transformation 508 is applied at the bit level within a data block/sector/packet. For example, the data transformation 508 may instruct the transformation module 506 to return N bytes of data in a given data block identified by LBA X, starting at offset Y. The N bytes of data starting at offset Y may represent a known type of data.

For example, in a database application, N bytes of data starting at offset Y may correspond to data in a fixed length column of a database table. By employing the example data transformation 508, the database application can retrieve only data for a particular column without having to retrieve an entire database table row, only to use the one column's data. Alternatively, as the block/sector/packet sizes continue to increase for block storage devices, employing a data transformation 508 such as a filter enables a client 114 to retrieve data of a more fine granularity than the block/sector/packet size and optionally apply a predicate or transformation operation on that data as well.

In another embodiment, the transformation module 506 applies a data transformation 508 to data identified by a set of LBAs (the LBAs may be a set of contiguous LBAs, noncontiguous LBAs or a combination of these). For example, the data transformation 508 may instruct the transformation module 506 to return for a given contiguous LBA range, the sum of the 4th byte from each Block/packet/sector in the range. By employing the example data transformation 508, the client 114 can perform certain operations on the data which reduces the amount of data passed back to the client 114.

In one embodiment, the solid state storage controller module 504 stores the data at the physical addresses on the solid-state storage media 110 using a log-based, append only writing structure such that data overwritten by a subsequent write request invalidates other data stored earlier in the log. Consequently, a garbage collection (or space recovery) process recovers the physical capacity of the invalid data in the log. One embodiment of the log-based, append only writing structure is logically a ring-like data structure, as new data is appended to the log-based writing structure, previously used physical capacity is reused in a circular, theoretically infinite manner. In such embodiments, the solid-state storage controller module 504 may write an LBA to the solid-state storage media 110. Storing the LBA on the solid-state storage media 110 identifies each sector/block/packet written as well as the sector/block/packet's physical location on the solid-state storage media 110.

Because the LBA is available to the transformation module 506, the transformation module 506 can apply data transformations 508 that relate to LBA's (either individually, or collectively in a contiguous range, or in sets of noncontiguous ranges). For example, the data transformation 508 may include a predicate such as return the last 4 bytes of each LBA having an address that is evenly divisible by four.

Those of skill in the art will appreciate other kinds of predicates and operations that can be applied to the data passing through the controller module 504. For example, a certain index key may be looked up in an index stored on the media 110. Alternatively, any arithmetic, conditional logic, or pattern matching, expression can be applied to the data.

The type, size, and complexity of the data transformation 508 depends on the level of granularity at which the predicate is to be applied, as well as the processing capabilities of the solid-state storage controller module 504. As noted above, the solid-state storage device 502 is dynamically programmable and/or configurable to execute a wide range of transformations 508 so long as the transformations 508 conform to a predefined language and grammar.

In certain embodiments, the solid-state storage controller module 504 comprises a processing module 512 that applies the data transformation 508 for the transformation module 506. The processing module 512 may support one or more predefined languages and/or grammars. The processing module 512 may convert a given transformation provided by a client 114 in a storage request into a data transformation 508 suitable for applying to the data flowing into or out of the solid-state storage media 110, may apply a predefined transformation, or the like.

The processing module 512 includes hardware processing logic capable of performing general processing functionality. In one embodiment, the processing module 512 and its associated hardware logic are Turing complete. In one embodiment, the processing module 512 comprises a separate FPGA, such as for example a Look Up Tables (LUTs) based FPGA. Alternatively, the processing module 512 comprises an application-specific integrated circuit ("ASIC"), custom logic solution, or a set of gates of an FPGA programmed to perform general purpose computing. Alternatively, the processing module 512 comprises a general purpose processor (e.g. CPU, GPU, PowerPC processor). The logic hardware of the processing module 512 may be the same hardware described above with regard to the solid-state storage controller module 504 and/or the transformation module 506, or may comprise separate logic hardware in communication with the solid-state storage controller module 504 and/or the transformation module 506.

For example, in one embodiment, the processing module 512 comprises logic hardware of the solid-state storage device 102, such as an FPGA, ASIC, general purpose processor, or the like of the solid-state storage controller module 504. In another embodiment, the processing module 512 may comprise logic hardware of the peer device 514, and the transformation module 506 may offload application of the data transformation 508 to the peer device 514. The peer device 514, in one embodiment, may be in communication with the solid-state storage device 102 independent of the computer 112 or other host device, such that communications between the solid-state storage device 102 and the peer device 514 use little or no system resources of the computer 112.

In one embodiment, the peer device 514 and the solid-state storage device 502 each communicate with the computer 112 or other host device over a PCIe bus. PCIe typically provides a higher bandwidth for communications between peers than for communications with a computer 112 or host device, as communications with the computer 112 or other host device are limited by the number of I/O pins of the processor and by other limits on system resources. The peer device 514, in one embodiment. may be a GPU that supports general purpose GPU ("GPGPU") functionality, such as Compute Unified Device Architecture ("CUDA"), Open Computing Language ("OpenCL"), DirectCompute, or the like. The peer device 514 may have more processing power, more processing cores, or the like than the solid-state storage controller module 504, allowing for more complicated or processor intensive data transformations 508. In one embodiment, the solid-state storage controller module 504 provides data from the solid-state storage device 502 directly to the peer device 514, making the offloading of the data transformation 508 to the peer device 514 more efficient than if data were transferred to the peer device 514 via the computer 112 or other host device.

The processing module 512 in one embodiment accepts a transformation having a variety of formats and/or syntax. The transformation may comprise a query, predicate, or transformation in the form of a Regular Expression (REGEX), Structured Query Language (SQL), XML Path Language (XPATH), or X Query expression along with context information that identifies where in the data flow (pipelines 106, 108) to apply the transformation.

The processing module 512 uses a language and grammar associated with the type of transformation provided. The processing module 512 converts the transformation provided into a data transformation 508 suitable for application by the transformation module 506. For example, the transformation may be in the form of script code or other human readable code such as source code. The processing module 512 may dynamically compile or interpret such source code or script code at run-time to generate the suitable data transformation 508. During operation the processing module 512 may use the DRAM 230 for temporary storage in performing its processing and translations. For example, the DRAM 230 may serve as a scratch pad for the processing module 512.

The data transformation 508 may be applied by the transformation module 506 in servicing data mining applications (e.g. client 114) and/or data warehouse applications submitting queries for the data on the solid-state storage media 110.

In certain embodiments, the client 114 and solid-state storage device 502 communicate using an interface 510. In certain embodiments, the interface 510 comprises an extension of an existing interface such as a block device interface (e.g. IOCTL calls). In another embodiment, the interface 510 comprises a separate or new interface specifically designed for managing transformations applied at the solid-state storage device 502. In one embodiment, the client 114 is an application and the interface 510 is an application level Application Programming Interface (API). In another embodiment, the client 114 is an Operating System (OS), File System (FS), or other application suited for directly interfacing with storage devices such as a Database Management System (DBMS), and the interface 510 is low level programming interface, which may comprise a proprietary interface.

In certain embodiments, the interface 510 includes new functions tailored specifically to client requests requesting, identifying, and triggering operation of the transformation module 506. Alternatively, the client request or indicator of which blocks/sectors/packets the transformation module 506 is to operate on and/or an indicator of the data transformation 508 are included in parameters of a storage request from the client 114.

The solid-state storage controller module 504 receives a client request or other transformation indicator that a particular data transformation 508 is to be applied to data sent or received by the solid-state storage controller module 504. The client request or other transformation indicator may identify particular sets of data (e.g. Blocks having an LBA within a particular range, a specific set of data associated with a given LBA, etc.). The client request or other transformation indicator may also include an identifier of the data transformation 508 to be applied or a definition of the data transformation 508 to be applied.

In one embodiment, the client requests or other transformation indicator passed in the interface 510 are passed on the same bus as the data bus (e.g. the data and control information/instructions are passed together in the same channel). Alternatively, the client requests or other transformation indicators passed in the interface 510 is passed over a control separate from the data bus (e.g. the data and control information/instructions are passed in separate communication channels). Alternatively, the client requests or other transformation indicators passed in the interface 510 is passed over the same control path used to communicate other I/O control messages. By separating the transformation information from the data, the bandwidth for data transfers is efficiently utilized.

Figure 6:
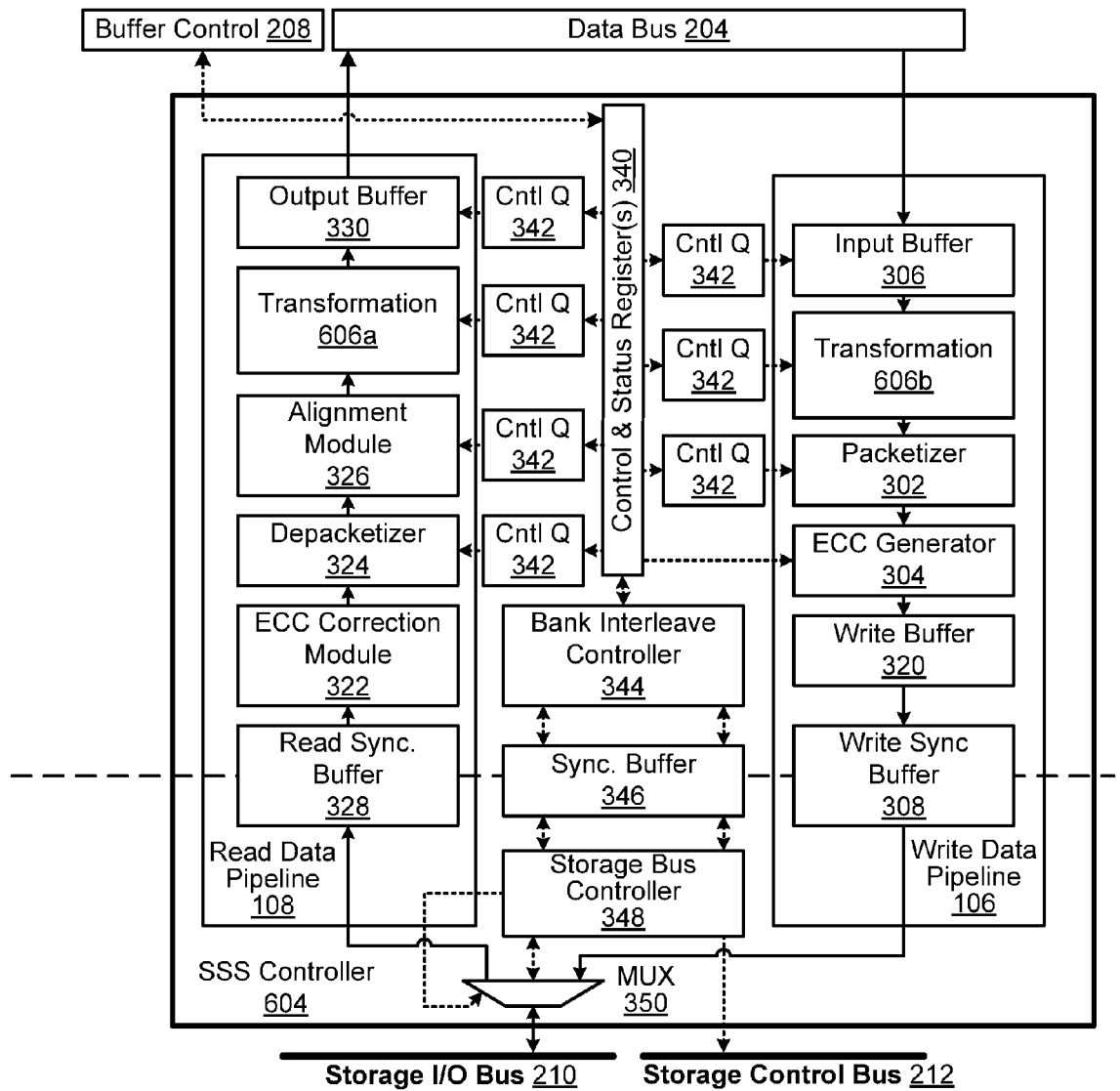
FIG. 6 is a schematic block diagram illustrating one embodiment of a solid-state storage device controller for transforming data in accordance with the present invention.

FIG. 6 illustrates one embodiment of a solid-state storage controller 604. FIG. 6 refers to elements of FIGS. 1, 2, and 3, like numbers referring to like elements. The illustrated embodiment does not show some of the components described above in order to avoid confusion and to aid in identifying the aspects used to implement this embodiment of the present invention.

The solid-state storage controller 604 comprises one or more transformation stages 606a, 606b that, in one embodiment are integrated into the read pipeline 108 and the write pipeline 106. In certain embodiments, the transformation stages 606a, 606b may comprise the write program module 310 and read program module 338 described above in relation to FIG. 3. In certain embodiments, the transformation stages 606a, 606b may comprise the functionality described in relation to the transformation module 506 described above relation to FIG. 5. Certain embodiments of the solid-state storage controller 604 may include one or the other of the transformation stages 606a, 606b.

As described above, data written to the storage media 110 flows through the write data pipeline 106 from the input buffer 306 to the write sync buffer 308 through each successive stage. Similarly, data read from the storage media 110 flows through the read data pipeline 108 from the read sync buffer 328 to the output buffer 330 through each successive stage. With the transformation stages 606a, 606b integrated into the pipelines 106, 108, each transformation stage 606a, 606b can apply a data transformation 508 to the data in the pipeline at the requested level of granularity. (e.g. packet/sector/block level, ECC chunk level, physical page level, logical page level, logical erase block level, and the like). In one embodiment, the transformation stages 606a, 606b synchronize their operations with the data flow by way of control commands stored in command control queues 342. The control and status registers 340 and control queues 342 facilitate control and sequencing commands and subcommands associated with data processed in the write and read data pipelines 106, 108.

In one embodiment, the solid-state storage controller 604 includes a transformation module 506 and the transformation stages 606a, 606b. In such an embodiment, the transformation module 506 may convert a given transformation provided by a client 114 into a set of control commands sent to the command control queues 342 to execute a data transformation 508. In another embodiment, a device driver or controller generates a set of control commands to send to the command control queues 342 without the use of the transformation module 506.

Certain data transformations 508 may apply solely to write storage requests, (e.g. Write the first 12 bytes of every fourth block/sector/packet) while other data transformations 508 may apply solely to read storage requests (e.g. a database field filter such as read the 3 bytes at offset 32 in each block/sector/packet for 10,000 blocks/sectors/packets). In still other data transformations 508, the transformation stage 606a, 606b may apply a data transformation 508 for read and write storage requests (e.g. Store a DIF/DIX data set with each write and verify a DIF/DIX data set with each read of a block/sector/packet). The DIF/DIX data set may optionally be removed by the transformation stage 606a.

One example of the solid-state storage controller module 504 applying a data transformation 508 solely to write storage request is where the solid-state storage controller module 504 serves as the final tier storage device in a tiered storage architecture in which the solid-state storage device 502 receives data that includes a DIF/DIX data set for data integrity purposes. In such an embodiment, the data transformation 508 applied in the transformation stage 606b of the write data pipeline 106 may verify the DIF/DIX data set of each block/sector/packet and/or signal an error if the verification fails. In this manner, such an embodiment validates or verifies the data prior to the data beings stored on the media 110.

In another embodiment, the transformation stages 606a, 606b may apply a data transformation 508 for one of a write storage request or a read storage request and another software layer in a storage hierarchy or another solid-state storage device 502 (e.g. where one solid-state storage device 502 shares a PCIe link to another solid-state storage device 502 and the two devices 502 serve to provide high availability in an active-active or active-passive configuration) may perform an inverse of the data transformation 508 for the other corresponding storage request (read/write). For example, where the solid-state storage device 502 serves as a cache for a backing store such as a block storage device (e.g. hard disk drive, SAN, etc), the solid-state storage controller module 504 may apply data transformations 508 for all write storage requests to add a DIF/DIX data set with each write. Blocks/sectors/packets exiting the transformation stage 606b include the DIF/DIX data set. These DIF/DIX protected blocks/sectors/packets may be sent to the backing store and to the next stage in the write data pipeline 106 (packetizer 302). Similarly, DIF/DIX protected blocks/sectors/packets read the backing store may enter the read data pipeline 108 at the transformation stage 606a such that the DIF/DIX data set can be verified with each read of a block/sector/packet from the backing store. In this manner, embodiments of the present invention use the transformation stages 606a, 606b to provide data transformations (including added data protections) data storage devices that are positioned behind the solid-state storage device 502 when viewed from the perspective of the client 114.

Embodiments that include the solid-state storage device 502 operating as a cache are described in U.S. patent application Ser. No. 12/877,971, filed Sep. 8, 2010 to David Flynn, et al, entitled "Apparatus, system, and method for caching data on a solid-state storage device", U.S. patent application Ser. No. 12/847,952, filed Jul. 30, 2010 to David Flynn, et al, entitled "Apparatus, system, and method for redundant write caching", U.S. patent application Ser. No. 12/885,285, filed Sep. 17, 2010 to David Flynn, et al, entitled "Apparatus, system, and method for graceful cache device degradation," U.S. Provisional Patent Application 61/373,271, filed Aug. 12, 2010 to David Flynn, entitled "Apparatus, system, and method for caching data," which are hereby incorporated by reference.

The control commands stored in command control queues 342 include sufficient instructions and metadata for the transformation stages 606a, 606b to apply the data transformation 508 to the appropriate set of data passing through the pipelines 106, 108. The control commands may be client requests or may include transformation information from client requests. For example, the control commands may identify how many bytes or data segments to allow to pass before applying a predicate/transformation and which data within the data segment to apply the predicate/transformation to. In addition, or alternatively, the control commands may include a trigger or marker to watch for in the data flow which causes the predicate/transformation to be applied. By managing the order and timing of control commands in the control queues 342 and/or the placement of markers or triggers in the data flowing though the pipelines 106, 108, the flow of the data and any applicable data transformations 508 is synchronized. In one embodiment, each clock cycle advances eight bytes through the pipelines 106, 108 to either the next stage or an intermediate buffer in the pipeline 106,108.

In one embodiment, the transformation module 506 may be implemented in a device driver for the solid-state storage device 502. The device driver may execute or operate on the computer 112. In such an embodiment, the benefits of applying a transformation 508 may be weighed against the processing overhead and resource utilization impacts on a host computer's processors and/or memory. As described in greater detail below, the transformation module 506 may offload certain data transformations 506 to the computer 112 or other host device for application to a data set.

In one embodiment, the transformation module 506 applies the data transformation 508 at a higher level of granularity for example processing a SQL query for a row of a database table. As the transformation module 506 applies the data transformation 508, the transformation module 506 may generate commands that are provided to the transformation stage 606b and/or transformation stage 606a.

These commands may implement all or part of the data transformation at the bit-level as data segments sized to pass through the pipeline 106,108. Data segments move through the pipeline 106, 108 at the rate of the local clock domain. Similarly, or in addition, the commands may operate on blocks/sectors/packets of data which comprise a plurality of data segments. In the example of a SQL query for a row of a database table, the transformation module 506 may receive a data transformation 508 that includes a layout of the structural relationship of blocks/sectors/packets to files, to extents, to tablespaces, to tables, to rows, to columns. The transformation module 506 may convert this relationship information into a command sent to the transformation stage 606b and/or transformation stage 606a. The command may indicate the particular block count and offset within a select block at which the transformation stage 606b and/or transformation stage 606a should do a comparison to see of the data in the pipeline 106, 108 matches a particular bit pattern. Blocks/sectors/packets satisfying the pattern may be identified for the transformation module 506 while blocks/sectors/packets not satisfying the pattern may be counted and discarded.

Those of skill in the art will recognize that because the relationships between data segments in the pipeline 106, 108 and fields within a row of a database table differ, the command may include instructions to skip a certain number of data segments and/or blocks/sectors/packets before applying a match condition. Skipped data segments and/or blocks/sectors/packets may be discarded or discarded and counted. The count of discarded data may be included in the return result to identify the magnitude of data reviewed in applying a data transformation 508.

In one embodiment, the transformation stages 606a, 606b gather or compute the results of applying the data transformation 508 at the rate that data flows through the pipelines 106, 108, referred to as line speed. In addition, the transformation stages 606a, 606b may maintain a count of data blocks/sectors/packets that fail to satisfy a data transformation 508 that comprises a predicate. The transformation stages 606a, 606b may gather the results within internal buffers or a common shared buffer used by the solid-state storage controller 604. Alternatively, the results may pool within a subsequent stage in the pipeline 106, 108.

Often the flow of data through the transformation stage 606a, 606b results in less data than the amount of data that entered the transformation stage 606a, 606b. Advantageously, the reduction in the amount of data maximizes the storage capacity available on the media 110 and/or use of bandwidth between the solid-state storage device 102 and the host computer 112 and/or client 114. In addition embodiments of the present invention perform the transformations as close to the persistently stored data as possible and retrieve for an application no more data than the client 114 such as a user application will need and use.

Often the bandwidth for data passing between the computer 112 and the solid-state storage device 102 over the system bus 240 (See FIG. 2) is less than the bandwidth for internal busses in the computer 112 or the solid-state storage device 102. For example, where the system bus 240 is a PCIe bus the bandwidth is limited to about 5.0 Gbps. Consequently, the system bus 240 may be a bottleneck that restricts the optimal flow of data to and from the solid-state storage device 102.

Figure 7:
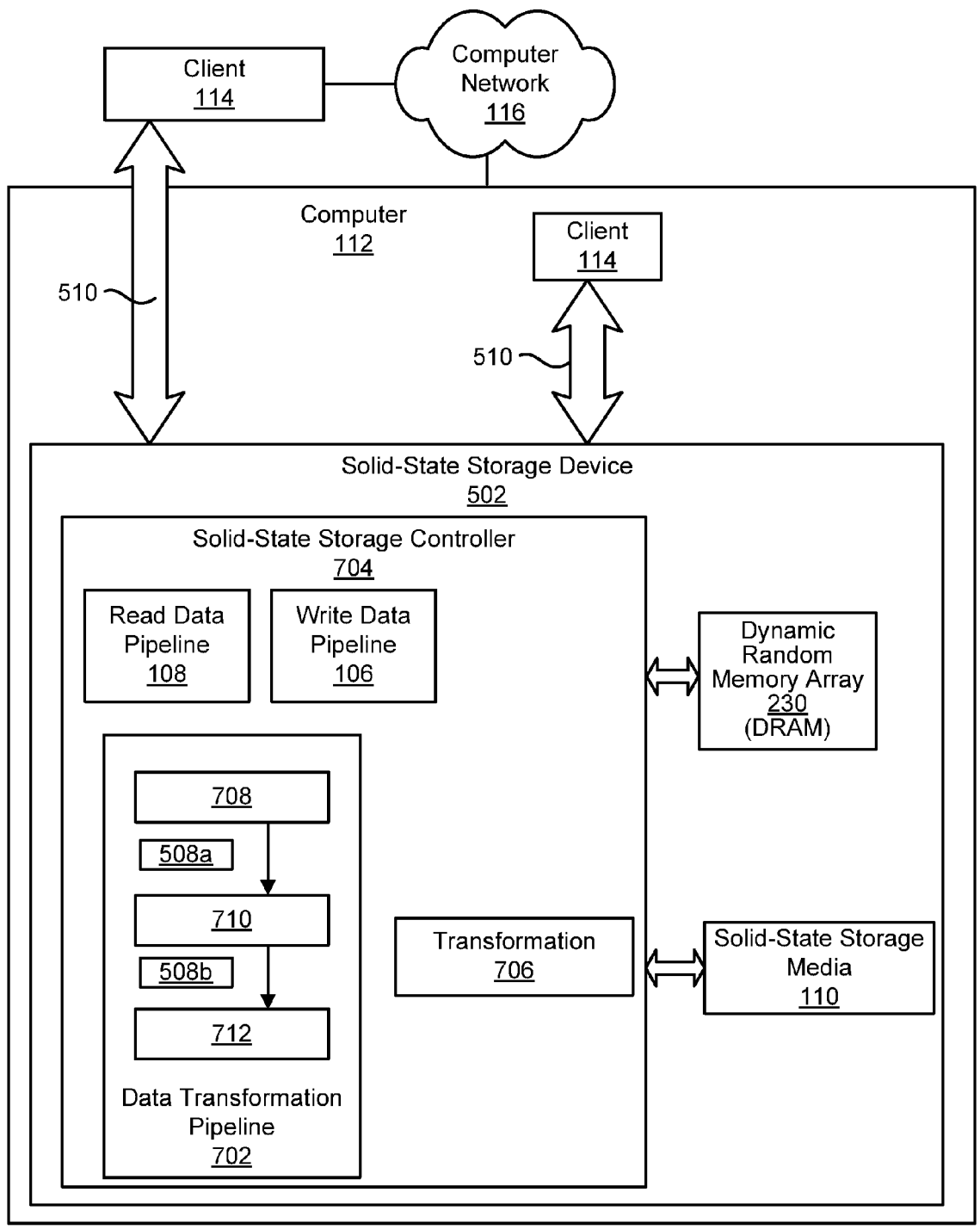
FIG. 7 is a schematic block diagram illustrating one embodiment of a solid-state storage device controller for transforming data in accordance with the present invention.

FIG. 7 illustrates one embodiment of a solid-state storage controller 704. FIG. 7 refers to elements of FIGS. 1, 2, 3, and 5, like numbers referring to like elements. The illustrated embodiment does not show some of the components described above in order to avoid confusion and to aide in identifying the aspects used to implement this embodiment of the present invention.

The solid-state storage controller 704 comprises a data transformation pipeline 702 and a transformation module 706. In certain embodiments, the transformation module 706 may comprise similar functionality to that described in relation to the transformation module 506 described above relation to FIG. 5.

The solid-state storage controller 704 illustrates an embodiment in which the data transformations 508 *a,b* pass through the data transformation pipeline 702 and are then applied to a data segment/packet/sector/block entering the write data pipeline 106 or exiting the read data pipeline 108.

The data transformation pipeline 702 independently receives transformations and prepares the transformations for application to data passing through one or both of the write data pipeline 106 and the read data pipeline 108. In one embodiment, the data transformation pipeline 702 comprises one or more optional stages such as a processing stage 708, a validation stage 710, and an efficiency stage 712. The processing stage 708 may function substantially similar to the processing module 512 described above. The processing stage 708 may convert a transformation from a non-executable state to an executable form of a data transformation 508a. The validation stage 710 may verify that the data transformation 508a is executable by the transformation module 706 and that the inputs for the data transformation 508a match the type and size of data passing through the associated data pipeline 106, 108. The efficiency stage 712 may apply certain heuristics to determine whether the overhead of applying the transformation is more efficient than having this transformation performed by the host CPU/computer 112. Those of skill in the art will recognize that the data transformation pipeline 702 may have zero or more stages depending on the format of the data transformation 508 supplied and on the amount of pre-processing desired for the data transformation 508. For example, in embodiments having zeros stages 708, 710, 712, the data transformation pipeline 702 may serve as a queue providing a sequence for data transformations 508 received.

The solid-state storage controller 704 may receive the transformations as part of a storage request, by way of a 3rd party client 114, by loading the transformations from a configuration file or other persistent store, or by way of a control channel between the solid-state storage device 502 and the client 114.

As mentioned above, the transformation module 706 uses a location identifier, a transformation, and an optional indicator of the return result requested. In one embodiment, the data transformation pipeline 702 supplies the next data transformation 508 to be applied to a data segment/sector/block/packet in the data pipeline 106, 108. In one embodiment, the transformation module 706 receives the location identifier by way of a control queue such as control queue 342. For example, the location identifier may identify a certain number of data segments to skip in one or both of the data pipelines 106, 108 before applying the next data transformation 508. Alternatively, the location identifier may comprise an address or marker of the data segment/sector/block/packet the transformation module 706 should use in applying the next data transformation 508.

By having a separate data transformation pipeline 702, the solid-state storage controller 704 may perform pre-processing and/or validation operations on a transformation. In addition, transformations passed to the data transformation pipeline 702 may be received over a communication channel separate from the data channel used for the other pipelines 106, 108. In addition, having a separate data transformation pipeline 702 may facilitate synchronization of application of a particular data transformation 508 with the data flow through the pipelines 106, 108 while optimizing data throughput. For example, any stalls in the pipelines 106, 108 may similarly stall the data transformation pipeline 702. In this manner, the transformation module 706 may simply apply the data transformation 508 at the tail end of the data transformation pipeline 702 when a marker or indicator is found in the appropriate data pipeline 106, 108.

In certain embodiments, the transformation module 706 identifies whether the data segment/sector/block/packet to use is in the write data pipeline 106 or the read data pipeline 108 by way of the location identifier. Alternatively, the type of data transformation 508 may identify which data pipeline 106, 108 to use.

In one embodiment, the transformation module 706 receives the optional indicator of the return result requested by way of a control queue such as control queue 342. In other embodiments, the return result is the result from applying the appropriate data transformation 508.

In certain embodiments, the transformation module 506 (Returning to FIG. 5) performs a comparison of the cost in terms of processing overhead, memory (e.g. DRAM 230) usage, and other factors versus the benefit in bandwidth utilization that a particular data transformation 508 will have. In certain embodiments, if a predefined or user defined efficiency metric is not satisfied, the transformation module 506 may reject the requested transformation 508 and thus not perform the transformation 508. In a further embodiment, if a requested data transformation 508 fails to satisfy the efficiency metric, the transformation module 506 offloads the requested data transformation 508 to the computer 112 or another host device, and the host device applies the data transformation 508 to a data set after the solid-state storage controller module 504 completes a storage operation for the data set and sends the data set or another result of the storage operation to the host device.

The efficiency metric, in one embodiment, is satisfied if the processing module 512 may apply the data transformation 508 at the speed of the corresponding pipeline 106, 108, "line speed." In another embodiment, whether a data transformation 508 satisfies the efficiency metric may be based on performance of the solid-state storage device 502 when the data transformation 508 is requested, such as I/O operations per second ("IOPS") for the solid-state storage device 502, workload pressure on the solid-state storage device 502, or the like. If performance of the solid-state storage device 502 fails to satisfy the efficiency metric when a data transformation 508 is requested, in certain embodiments, the transformation module 506 offloads the data transformation 508 to the computer 112 for application.

In another embodiment, the efficiency metric is based on a current available bandwidth between the solid-state storage device 502 and the computer 112 or other host device. For example, if an amount of available bandwidth satisfies a bandwidth threshold, in certain embodiments, applying a data transformation 508 on the solid-state storage device 502 itself may not be beneficial, as bandwidth is available and the computer 112 may apply the data transformation 508.

In one embodiment, the transformation module 506 may dynamically determine whether a requested data transformation 508 satisfies the efficiency metric with each client request or other transformation indicator, selectively assigning the data transformation 508 to either the processing module 512 within the solid-state storage device 502 or to the computer 112 or other host device. In another embodiment, whether or not a data transformation 508 satisfies the efficiency metric is predetermined for the transformation module 506, and certain data transformations 508 are applied within the solid-state storage device 502 by the processing module 512 and other data transformations 508 are applied on the computer 112 or other host device. In one embodiment, a device driver for the solid-state storage device 502 applies the data transformation 506 on the computer device 112.

Certain data transformations 508 may increase the size of the data set as a result of the transformation. In certain embodiments, the transformation module 506 determines that a data transformation 508 that increases the size of the data should be performed because the offloading of this transformation to the solid-state storage device 502 may cause an improvement in overall processing efficiency due to the reduction in processing over head on a host CPU in the computer 112.

Conversely, certain data transformations 508 may decrease the size of the data set as a result of the transformation. But, there may be little or no bandwidth constraint between the solid-state storage device 502. Consequently, the transformation module 506 may reject or not perform a given data transformation 508 because the increased overhead does not lead to an overall increase in processing efficiency in the computer 112. In other words, the host CPU/computer 112 may more efficiently perform the data transformation 508, and the transformation module 506 may offload the data transformation 508 as described above. Advantageously, the transformation module 506 is configured to determine these differences in processing efficiencies and facilitates performance of the transformation at the most efficient level between the solid-state storage device 502 and the client 114.

In one embodiment a client 114 (e.g. user space application, operating system, file system, and the like) uses an Application Programming Interface (API) that exposes functionality of the transformation module 506. In certain embodiments, a device driver for the solid-state storage device 502 may make the API available to the client 114 and may receive API calls, such as client requests, from the client 114. The client 114 may use the API to determine whether a particular data transformation 508 will provide the expected efficiency gains. The client 114 may use the API to send client requests, define the data transformation 508, monitor the progress of data transformations 508, and receive feedback from the transformation module 506 associated with a data transformation 508.

Of course, what the efficiency level is, and when to reject a given data transformation 508 may be managed by a storage policy. The efficiency threshold represents a trade off between bandwidth limitations between the solid-state storage device 102 and the computer 112 or host and the processing overhead of performing the transformation within the solid-state storage device 102.

Advantageously, embodiments of the present invention perform a dynamic and configurable set of data transformations within a solid-state storage device 102. Furthermore, embodiments of the present invention enable the software application such as the client 114 to manage and direct which data transformations 508 are applied to which blocks/sectors/packets (both noncontiguous sets and contiguous ranges of blocks/sectors/packets. Embodiments of the present invention enable client/Application requested data transformations 508 to be performed in a solid-state storage device 102.

In addition, embodiments of the present invention perform a data transformations at the same rate that I/O data flows through the pipelines 106, 108 (e.g. "line speed") with minimal overhead introduced into the stages. In exchange for the minimal overhead, the only the data desired by a client 114 is stored or returned from the solid-state storage device 102 which in turn optimizes use of bandwidth between the solid-state storage device 102 and the host/computer 112.

Figure 8:
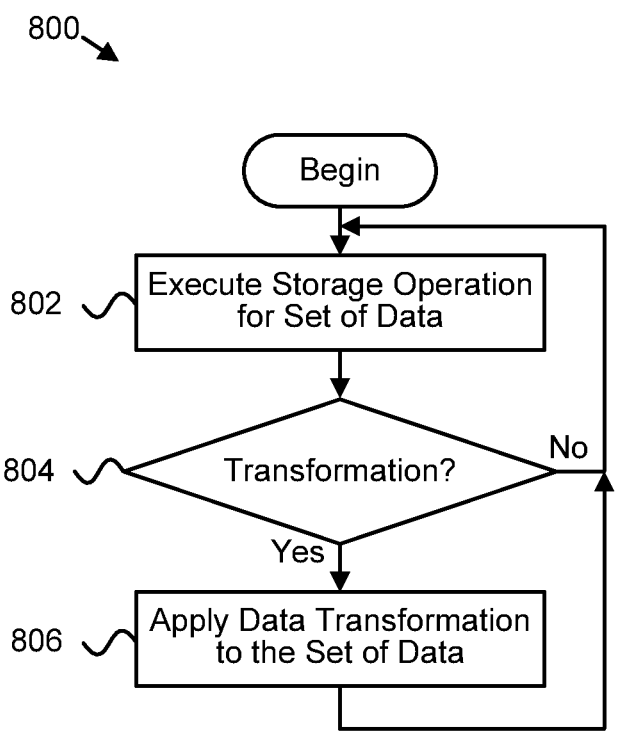
FIG. 8 is a schematic flow chart diagram illustrating one embodiment of a method for transforming data in accordance with the present invention.

FIG. 8 depicts one embodiment of a method 800 for transforming data. The method 800 begins, and the storage controller module 504 executes 802 a storage operation for a set of data within a data storage device 504. The transformation module 506 determines 804 whether or not to apply a data transformation 508 to the set of data based on a client request or other transformation indicator. If the transformation module 506 determines 804 not to apply a data transformation 508 to the set of data, the method 800 continues as the storage controller module 504 executes 802 further storage operations. If the transformation module 506 determines 804 to apply a data transformation to the set of data, the processing module 512 applies 806 the data transformation to the set of data prior to the storage controller module 504 completing execution 802 of the storage operation, and the method 800 continues.

Figure 9:
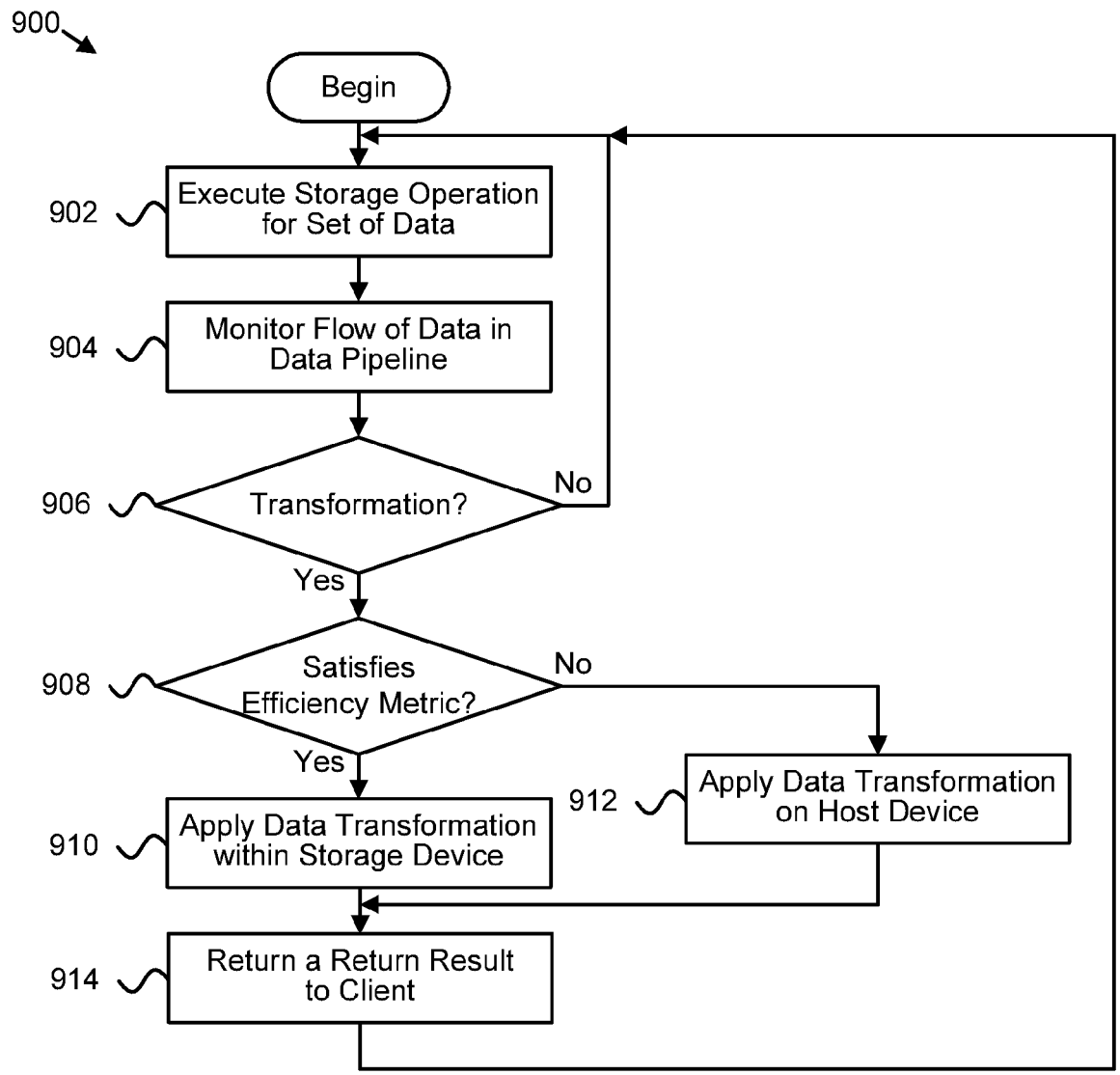
FIG. 9 is a schematic flow chart diagram illustrating another embodiment of a method for transforming data in accordance with the present invention.

FIG. 9 depicts another embodiment of a method 900 for transforming data. The method 900 begins, and the storage controller module 504 executes 902 a storage operation for a set of data within a data storage device 504. The transformation module 506 monitors 904 a flow of data within one or more data pipelines 106, 108 to identify sets of data with data that satisfies a location identifier associated with a client request or other transformation indicator. The transformation module 506 determines 906 whether or not to apply a data transformation 508 to an identified set of data based on the client request or other transformation indicator.

If the transformation module 506 determines 906 not to apply a data transformation 508 to the set of data, the method 900 continues as the storage controller module 504 executes 902 further storage operations. If the transformation module 506 determines 906 to apply a data transformation 508 to the set of data, the transformation module 506 determines 908 whether the data transformation 508 satisfies an efficiency metric.

If the data transformation 508 satisfies 908 the efficiency metric, the processing module 512 applies 910 the data transformation to the set of data internally within the storage device 502. If the data transformation 508 does not satisfy 908 the efficiency metric, a computer 112 or other host device of the storage device 502 applies 912 the data transformation 508. The storage controller module 504 returns 914 a return result to the client 114 to satisfy the storage operation, and the method 800 continues as the storage controller module 504 executes 902 further storage operations.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
   initiating a block I/O operation for a set of data of a data storage device;
   determining whether to apply a data transformation to the set of data in response to a client request, the client request defining the data transformation and comprising a request to apply the data transformation;
   determining that applying the data transformation satisfies an efficiency metric by being capable of being applied at a full data rate for a data pipeline configured to service the data transformation at the storage device;
   applying the data transformation to the set of data at the storage device in response to the determination that applying the data transformation satisfies the efficiency metric, the data transformation being applied prior to completing the block I/O operation;
   determining that applying a second data transformation to a second set of data fails to satisfy the efficiency metric by not being capable of being applied at the full data rate; and
   applying the second data transformation to the second set of data at a host device, using a device driver for the storage device, in response to the determination that the second data transformation fails to satisfy the efficiency metric.

2. The method of claim 1, further comprising monitoring a flow of data within a data pipeline to identify the set of data, at least a portion of data in the set of data satisfying a location identifier associated with the client request, the location identifier comprising a logical or physical storage location associated with the data storage device.

3. The method of claim 2, wherein the data transformation is performed in a data transformation pipeline that is separate from the data pipeline.

4. The method of claim 1, further comprising returning to a client a return result satisfying the block I/O operation, the return result comprising a result of applying the data transformation to the set of data.

5. The method of claim 4, wherein the return result comprises a smaller size than the set of data.

6. The method of claim 1, wherein the client request comprises a location identifier for the set of data and an identifier of the data transformation.

7. The method of claim 6, wherein the identifier of the data transformation comprises a definition of the data transformation.

8. The method of claim 1, wherein the data transformation comprises adding data integrity information to the set of data.

9. The method of claim 8, further comprising storing the set of data and the data integrity information on a second data storage device, wherein a data integrity protocol of the data integrity information is unsupported by the second data storage device.

10. The method of claim 1, wherein the data transformation comprises a filter transformation, the filter transformation reducing a size of the set of data by excluding data that satisfies a predicate condition.

11. The method of claim 10, further comprising setting the predicate condition based on the client request.

12. The method of claim 1, wherein the client request comprises a write request for an amount of data less than a block size for the data storage device, and the data transformation comprises reading a data block for the set of data, modifying the data block with the set of data at a data offset within the data block, and writing the modified data block to the data storage device, the data transformation applied internally on the data storage device.

13. The method of claim 1, wherein the client request comprises a transformation request, the transformation request comprising one of a synchronous transformation request for a storage request; an asynchronous transformation request for a storage request; a transformation request for a plurality of storage requests; a transformation request for a set of logical block addresses of the data storage device; and a global transformation request for the data storage device.

14. The method of claim 1, wherein the block I/O operation comprises one of reading data, writing data, validating data, and deleting data.

15. The method of claim 1, wherein the client communicates with the data storage device using a block interface comprising a transformation indicator.

16. An apparatus comprising:
a storage controller module configured to control a block I/O operation for a set of data of a data storage device;
a transformation module configured to determine whether to apply a data transformation to the set of data in response to a transformation indicator provided by a client request that identifies the block I/O operation and the data transformation and to determine whether the data transformation is capable of being applied at a full data rate for a data pipeline configured to service the block I/O operation within the data storage device, the data transformation comprising one or more of adding data integrity information to the set of data, applying a predicate to return a Boolean result, applying a predicate to return a count of data entries that satisfies the predicate, applying a predicate to return a count of data entries that fail to satisfy the predicate, discarding a portion of a data block to return a requested sub-block, and writing a data block with a modified portion; and
a processing module configured to apply the data transformation to the set of data internally on the data storage device prior to completing the block I/O operation in response to the transformation module determining that the data transformation is capable of being applied at the full data rate, and to apply the data transformation to the set of data at a host device, using a device driver for the data storage device, in response to the transformation module determining that the data transformation is not capable of being applied at the full data rate.

17. The apparatus of claim 16, wherein the transformation module is configured to monitor a flow of data within a data pipeline to identify the set of data, at least a portion of data in the set of data satisfying a location identifier associated with the client request.

18. The apparatus of claim 16, wherein the storage controller module is configured to return to a client a return result satisfying the block I/O operation, the return result comprising a result of applying the data transformation to the set of data.

19. A system comprising:
a solid-state data storage device in communication with a host device over a communications bus;
a storage controller module that controls a block I/O operation for a set of data of the data storage device;
a modification module that determines whether to apply a data modification to the set of data in response to a client request that identifies the data modification, and that determines whether applying the data modification satisfies an efficiency metric by being capable of being applied at a full data rate of the communications bus; and
a processing module that applies the data modification to the set of data within the solid-state data storage device in response to the modification module determining that applying the data modification satisfies the efficiency metric, and that applies the data modification to the set of data at the host device, using a device driver for the data storage device, in response to the modification module determining that applying the data modification fails to satisfy the efficiency metric.

20. The system of claim 19, wherein the processing module comprises logic hardware of the data storage device, the logic hardware comprising one or more of a field-programmable gate array, an application-specific integrated circuit, and a general purpose processor.

21. The system of claim 19, wherein the processing module comprises a peer logic hardware device in communication with the data storage device independent of the host device, the peer logic hardware device applying the data modification to the set of data.

22. The system of claim 19, further comprising the host device and the device driver for the data storage device executing on the host device, the device driver receiving the client request from a client and sending the client request to the data storage device over the communications bus.

23. An apparatus, comprising:
a storage controller configured to control a block I/O operation configured to retrieve a set of data from a data storage media; and
a transformation module configured to define a transformation data set that satisfies a predicate condition from the set of data and that is smaller than the set of data, wherein the transformation module is configured to define the transformation data set based on a request from a client, in response to a transformation indicator associated with the block I/O operation, to define the transformation data set internally within a storage device comprising the data storage media in response to a determination that generating the transformation data set satisfies an efficiency metric by being capable of being generated at a full data rate for a data pipeline configured to service the request, and to define the transformation data set at a host device, using a device driver for the storage device, in response to a determination that generating the transformation data set fails to satisfy the efficiency metric by not being capable of being applied at the full data rate.

24. A method comprising:
configuring a solid-state storage controller module to act as an intermediary between a storage client and a solid state storage media, the solid state storage controller module including a read pipeline for processing a block I/O read request to the solid-state storage media and a write pipeline for processing a block I/O write request to the solid-state storage media;
processing a first request from the storage client while using the solid-state storage controller module to apply a data transformation to data of the first request at a storage device comprising the solid state storage media in response to a determination that the data transformation for the data of the first request is capable of being applied at a full data rate for one or more of the read pipeline and the write pipeline; and processing a second request from the storage client while using the solid-state storage controller module to apply a data transformation to data of the second request at a host device using a device driver for the storage device in response to a determination that the data transformation for the data of the second request is incapable of being applied at a full data rate for one or more of the read pipeline and the write pipeline.

* * * * *